(12) United States Patent
Chen et al.

(10) Patent No.: US 7,892,881 B2
(45) Date of Patent: Feb. 22, 2011

(54) FABRICATING A DEVICE WITH A DIAMOND LAYER

(75) Inventors: Mary Y. Chen, Oak Park, CA (US); Peter W. Deelman, Calabasas, CA (US)

(73) Assignee: Raytheon Company, Waltham, MA (US)

( * ) Notice: Subject to any disclaimer, the term of this patent is extended or adjusted under 35 U.S.C. 154(b) by 105 days.

(21) Appl. No.: 12/390,593

(22) Filed: Feb. 23, 2009

(65) Prior Publication Data

US 2010/0216301 A1    Aug. 26, 2010

(51) Int. Cl.
*H01L 21/00* (2006.01)
(52) U.S. Cl. .................. 438/105; 257/77; 257/E21.005
(58) Field of Classification Search ........... 438/105; 257/77, E21.005
See application file for complete search history.

(56) References Cited

U.S. PATENT DOCUMENTS

| | | | |
|---|---|---|---|
| 5,252,840 A | 10/1993 | Shiomi et al. | |
| 5,277,975 A | 1/1994 | Herb et al. | |
| 5,633,516 A * | 5/1997 | Mishima et al. | 257/190 |
| 5,726,463 A * | 3/1998 | Brown et al. | 257/77 |
| 5,962,345 A * | 10/1999 | Yen et al. | 438/709 |
| 6,255,712 B1 | 7/2001 | Clevenger et al. | |
| 2003/0170458 A1 | 9/2003 | Noguchi | |
| 2005/0139838 A1 | 6/2005 | Murata et al. | |
| 2006/0081985 A1 | 4/2006 | Beach et al. | |
| 2006/0113546 A1 | 6/2006 | Sung | |
| 2007/0126026 A1 | 6/2007 | Ueno et al. | |
| 2007/0272929 A1 | 11/2007 | Namba et al. | |
| 2008/0181550 A1* | 7/2008 | Earnshaw | 385/1 |
| 2008/0206569 A1 | 8/2008 | Whitehead et al. | |
| 2009/0146186 A1* | 6/2009 | Kub et al. | 257/194 |
| 2010/0001292 A1 | 1/2010 | Yamasaki et al. | |
| 2010/0155900 A1 | 6/2010 | Korenstein et al. | |
| 2010/0155901 A1 | 6/2010 | Korenstein et al. | |
| 2010/0187544 A1 | 7/2010 | Korenstein et al. | |

FOREIGN PATENT DOCUMENTS

| | | |
|---|---|---|
| EP | 0 457 508 | 11/1991 |
| EP | 2 015 353 A1 | 1/2009 |
| JP | 2005 210105 | 8/2005 |
| WO | WO 2006/117621 | 11/2006 |
| WO | WO 2007/122507 | 11/2007 |
| WO | WO 2008/147538 | 12/2008 |

OTHER PUBLICATIONS

Choi et al. "Properties of natural diamond microlenses fabricated by plasma etching", Industrial Diamond Review, Issue 2, 2005, p. 29.*

(Continued)

*Primary Examiner*—Laura M Menz
*Assistant Examiner*—Sonya D McCall Shepard
(74) *Attorney, Agent, or Firm*—Daly, Crowley, Mofford & Durkee, LLP

(57) ABSTRACT

In one aspect, a method includes forming a silicon dioxide layer on a surface of a diamond layer disposed on a gallium nitride (GaN)-type layer. The method also includes etching the silicon dioxide layer to form a pattern. The method further includes etching portions of the diamond exposed by the pattern.

30 Claims, 26 Drawing Sheets

OTHER PUBLICATIONS

Notification of International Search Report and Written Opinion of the International Searching Authority for PCT/US2009/068180, dated Mar. 16, 2010, 9 pages.

Notification of International Search Report and Written Opinion of the International Searching Authority for PCT/US2009/068178, dated Mar. 16, 2010, 7 pages.

File downloaded for U.S. Appl. No. 12/341,191, filed Dec. 22, 2008, file through May 3, 2010, 307 pages.

File downloaded for U.S. Appl. No. 12/341,115, filed Dec. 22, 2008, file through May 3, 2010, 281 pages.

File downloaded for U.S. Appl. No. 12/753,354, filed Apr. 2, 2010 file through Jun. 11, 2010, 272 pages.

Baik, et al. "Control of diamond micro-tip geometry for field emitter", Thin Solid Films, vol. 377-378 Dec. 2000, XP004226709, pp. 299-302.

Notification of International Search Report and Written Opinion of the International Searching Authority for PCT/US2010/024878, dated Jun. 7, 2010, 13 pages.

U.S. Appl. No. 12/341,191, Ralph Korenstein, et al., filed Dec. 22, 2008, 32 pages.

U.S. Appl. No. 12/341,115, Ralph Korenstein, et al., filed Dec. 22, 2008, 30 pages.

Francis, et al., "GaN-HEMT Epilayers on Diamond Substrates: Recent Progress", CS ManTech 2007, 4 pages.

File downloaded for U.S. Appl. No. 12/341,191, filed Dec. 22, 2008, file May 4, 2010 through Sep. 30, 2010, 74 pages.

File downloaded for U.S. Appl. No. 12/341,115, filed Dec. 22, 2008, file May 4, 2010 through Sep. 30, 2010, 19 pages.

File downloaded for U.S. Appl. No. 12/753,354, filed Apr. 2, 2010 file Jun. 12, 2010 through Sep. 30, 2010, 26 pages.

* cited by examiner

FABRICATING A DEVICE WITH A DIAMOND LAYER

BACKGROUND

Gallium Nitride (GaN) has electrical and physical properties that make it highly suitable for high frequency (HF) and/or high power microwave devices. These devices produce a high amount of heat requiring a heat spreader to be attached to the devices to avoid device failure. One such heat spreader is diamond. A number of processes include forming diamond on a bottom surface of an HF and/or high power device opposite a top surface. The top surface of the HF device includes, for example, a source, a drain and a gate. In one example, a hot filament chemical vapor deposition (CVD) process has been used to form diamond that is used with GaN layers. Generally, these diamond layers are not deposited directly onto the GaN layers but onto some other material (e.g., silicon, silicon carbide, and so forth) that is eventually disposed with the GaN layer.

SUMMARY

In one aspect, a method includes forming a silicon dioxide layer on a surface of a diamond layer disposed on a gallium nitride (GaN)-type layer, etching the silicon dioxide layer to form a pattern and includes etching portions of the diamond exposed by the pattern.

In another aspect, a method includes forming a silicon dioxide layer on a diamond layer disposed on a gallium nitride (GaN)-type layer, etching portions of the silicon dioxide based on a first isolation mask to expose portions of the diamond layer, etching the portions of the diamond layer exposed by the silicon dioxide after the first etch, etching portions of the silicon dioxide layer based on an ohmic contact/gate mask to expose a first portion and a second portion of the diamond layer, etching the first portion and the second portion of the diamond layer to expose a first portion and a second portion of the GaN-type layer and etching portions of the GaN-type layer based on a second isolation mask.

In another aspect, a method includes forming a first silicon dioxide layer on a diamond layer disposed on a gallium nitride (GaN)-type layer, etching portions of the first silicon dioxide layer based on a first ohmic mask to expose portions of the diamond layer, etching the portions of the diamond layer exposed by the first silicon dioxide layer to expose a first portion of the GaN-type layer, forming a second silicon dioxide layer on the diamond layer and the exposed first portion of the GaN-type layer, etching a first portion of the second silicon dioxide layer based on a first isolation mask to expose portions of the diamond layer, etching the first portion of the diamond layer exposed by the second silicon dioxide, etching a second portion of the second silicon dioxide layer and etching the second portion of the diamond layer exposed by the second silicon dioxide based to expose a second portion of the GaN-type layer.

In a further aspect, a method includes forming a silicon dioxide layer on a diamond layer disposed on a gallium nitride (GaN)-type layer, etching portions of the silicon dioxide layer based on a multipurpose mask to expose portions of the diamond layer and etching the portions of the diamond layer exposed by the silicon dioxide to expose a first portion and a second portion of the GaN-type layer.

DETAILED DESCRIPTION

Figure 1:
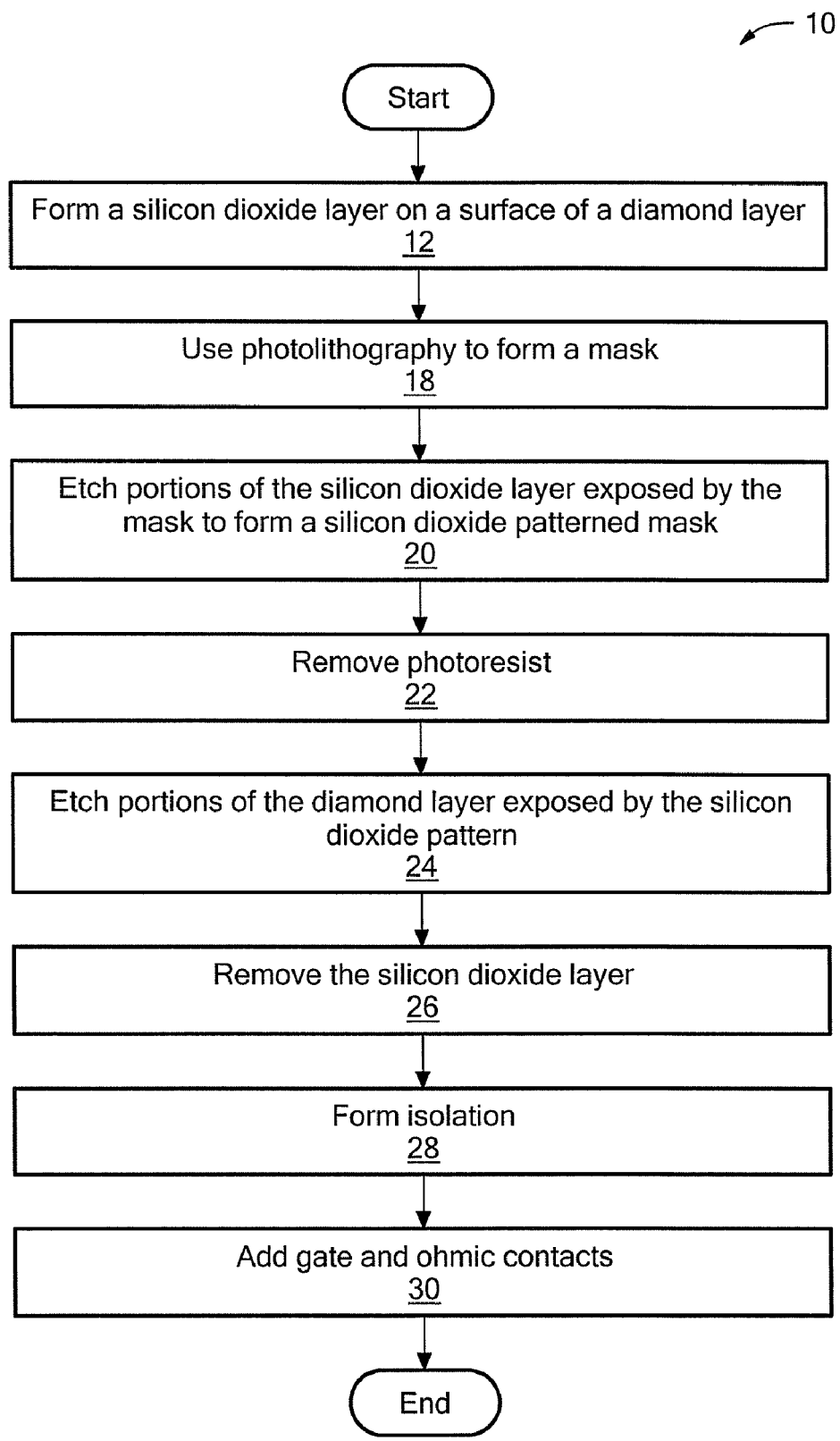
FIG. 1 is a flowchart of an example of a process to fabricate a device with a diamond layer.

While placing diamond on a bottom surface effectively reduces heat in a device (e.g., the device may be a high frequency device, a high electron mobility transistor (HEMT), a high power microwave device, a heterostructure Field Effect Transistor (HFET) and so forth), placing a diamond layer on top of the device can further contribute to spreading heat. For example, a diamond layer adjacent to a gate in a high frequency (HF) and/or high power transistor may effectively spread heat away from the gate. However, forming a diamond layer in such devices requires a process that integrates diamond processing with device fabrication processing. Described herein are several alternatives to forming diamond on a top surface of a gallium nitride (GaN)-type layer in device fabrication. As used herein a GaN-type layer may include undoped GaN, doped GaN or GaN combined with other elements (e.g., AlGaN) or any combination thereof. In one example, GaN-type layer may include multiple layers of GaN-type layers (e.g., a layer of AlGaN on top of a layer of undoped or doped GaN). In some examples, the GaN-type layer is a substrate.

Referring to FIGS. 1 and 2A to 2H, an example of a process to fabricate a device 60 with a GaN layer and a diamond layer is a process 10. A silicon dioxide layer 42 is formed on a diamond layer 32 which is disposed on a GaN-type layer 36 (FIG. 2A) (12). In one example, a 1,000 Angstrom silicon dioxide layer is deposited using plasma enhanced chemical vapor deposition (PECVD). The GaN-type layer 36 is typically grown on another material, for example, silicon carbide 38.

Figure 2A:
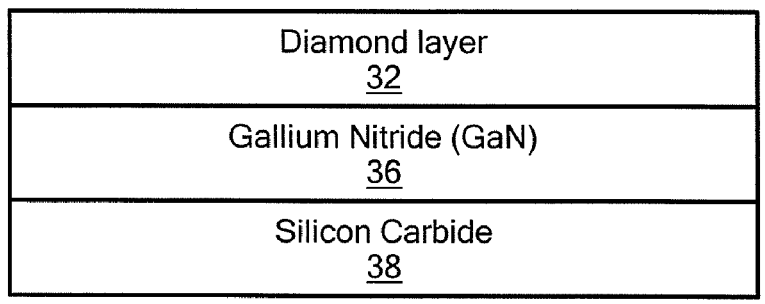
FIGS. 2A to 2H are diagrams corresponding to the process of FIG. 1.
Figure 2B:
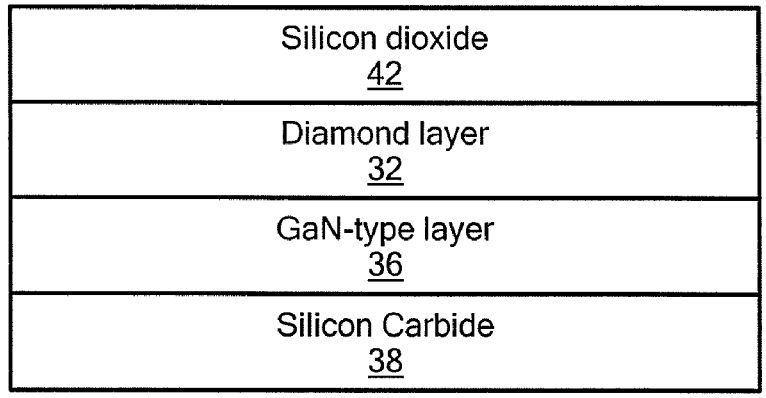
Figure 2C:
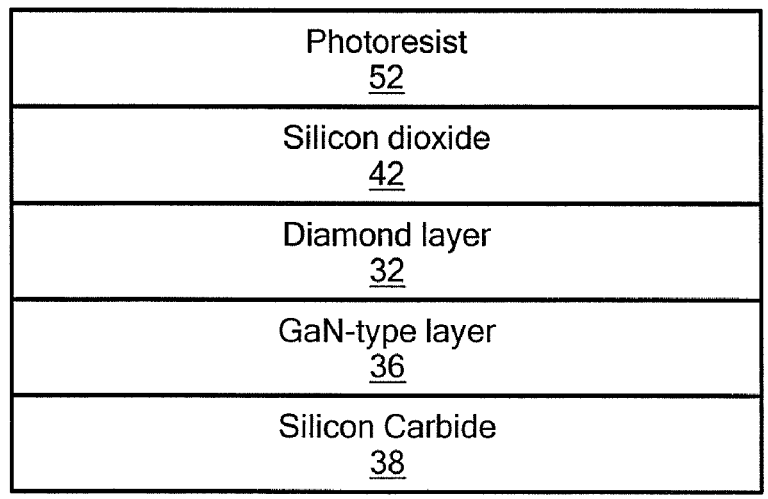

Using photolithography, a mask is formed on the silicon dioxide 42 (18). For example, photoresist 52 is deposited on the silicon dioxide layer 42 (FIG. 2B) and an overlay (not shown) in the form of the mask is placed on or directly above the photoresist 52. The photoresist 52 that is not covered by the overlay is exposed to ultraviolet light, for example. Depending on the type of photoresist (either positive photoresist or negative photoresist), either the photoresist exposed by the ultraviolet light is removed or the photoresist not exposed by the ultraviolet light is removed. The remaining portions of the photoresist 52 form the mask (FIG. 2C).

Figure 2D:
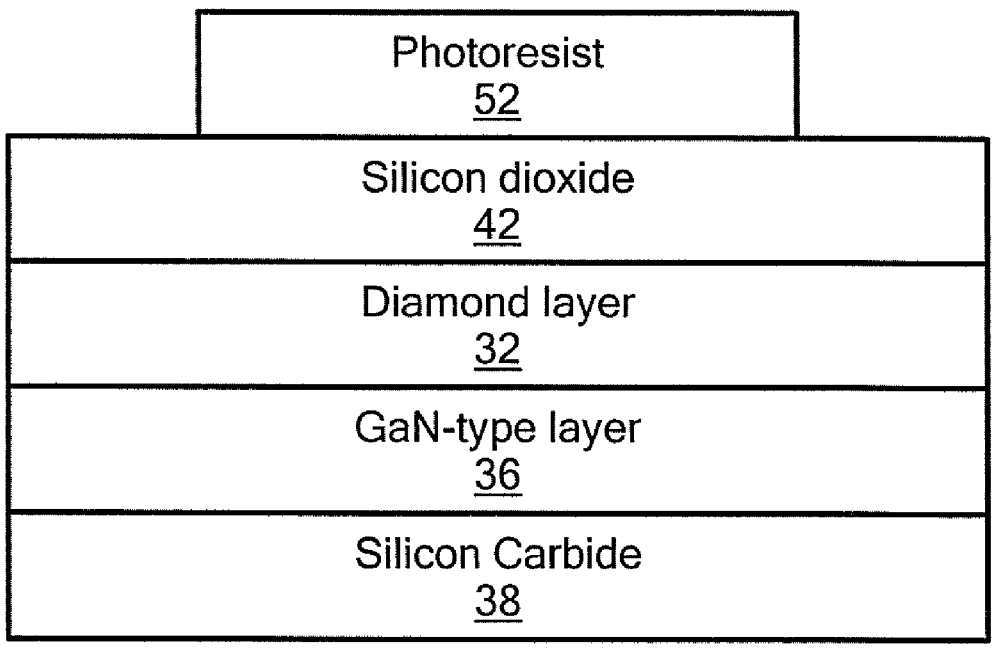

Portions of the silicon dioxide 42 that are exposed by the mask (i.e., the portions of the silicon dioxide 42 that are not covered by photoresist 52) are etched (20) (FIG. 2D). For example, the exposed portions of the silicon dioxide 42 are etched using an inductively coupled plasma (ICP) process using a carbon tetrafluoride and oxygen mixture.

Figure 2E:
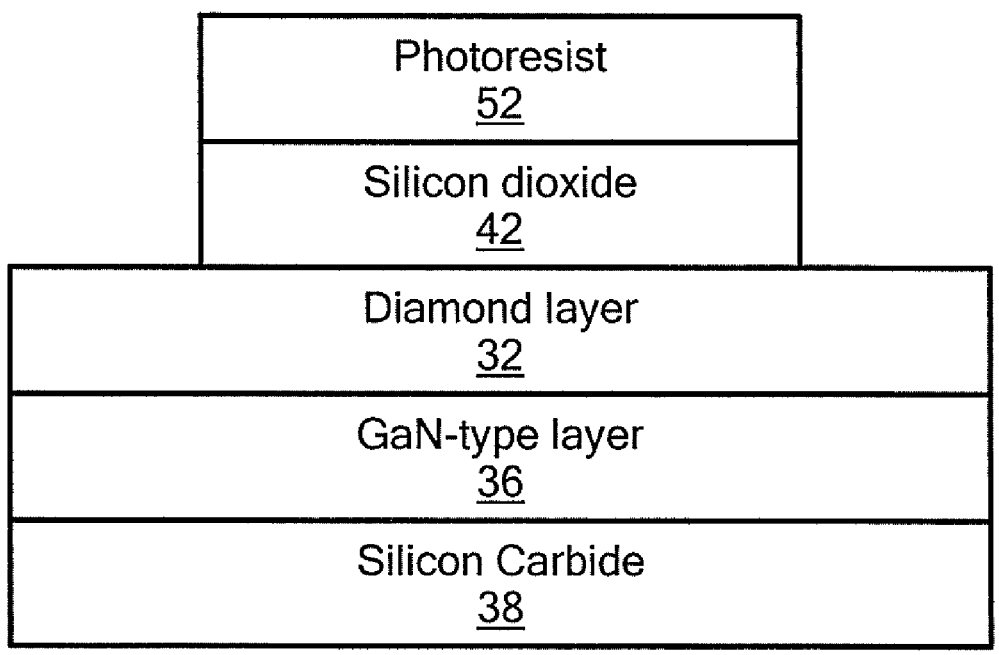

The photoresist 52 is removed (22) (FIG. 2E). In one example, the photoresist 52 is thinned prior to removal. The remaining silicon dioxide layer 42 becomes an extension of the mask to form a silicon dioxide patterned mask.

Figure 2F:
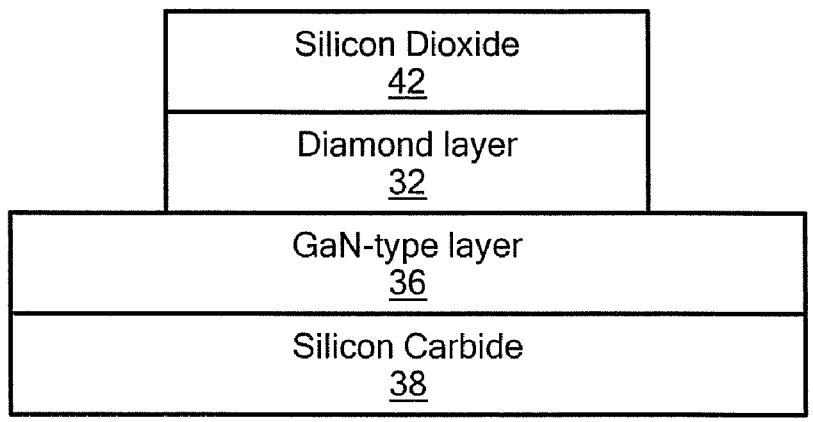
Figure 2G:
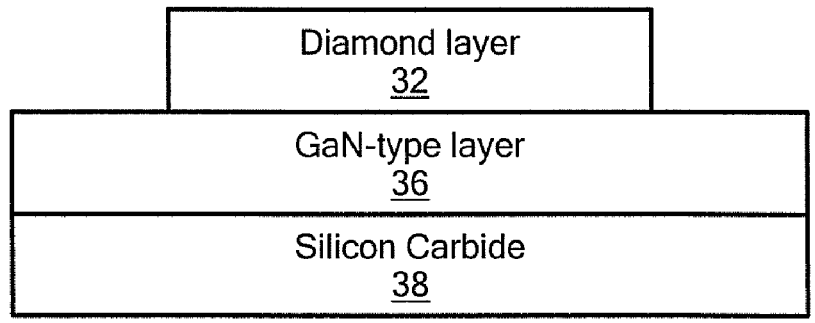

Positions of the diamond layer 32 that are exposed by the silicon dioxide patterned mask (i.e., the portions of the diamond layer 32 that are not covered by the silicon dioxide 42) are etched (24) (FIG. 2F). For example, the exposed portions of the diamond layer 32 are etched using, for example, the ICP process using an oxygen mixture or an oxygen and argon mixture. In one example, the etching of the diamond layer 32 extends down to but does not include the GaN-type layer 36.

The silicon dioxide layer 42 is removed (26) (FIG. 2G), for example, using a hydrogen fluoride (HF) based solution (e.g., hydrofluoric acid).

Figure 2H:
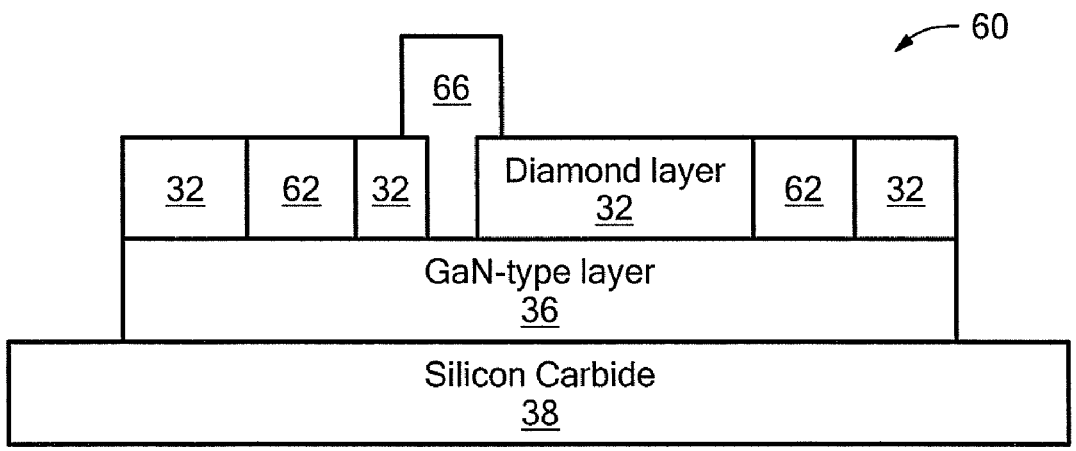

Isolation is formed, for example, by etching the GaN-type layer 36 (28) and a gate 66 and two ohmic contacts 62 (e.g., a source and a drain) are added to form the device 60 (30) (FIG. 2H). For example, the device 60 may be formed by using a combination of photolithographic steps, metallization steps and/or repeating one or more of the processing blocks 12, 18, 20, 22, 24, 26, 28 and 30.

Other processing steps may be used with processing blocks 12, 18, 20, 22, 24, 26, 28 and 30 to fabricate the device 60. As will be described, processes 100, 200 and 300 are specific examples to form the device 60 using the process 10. Other examples are apparent to one of ordinary skill in the art.

Figure 3:
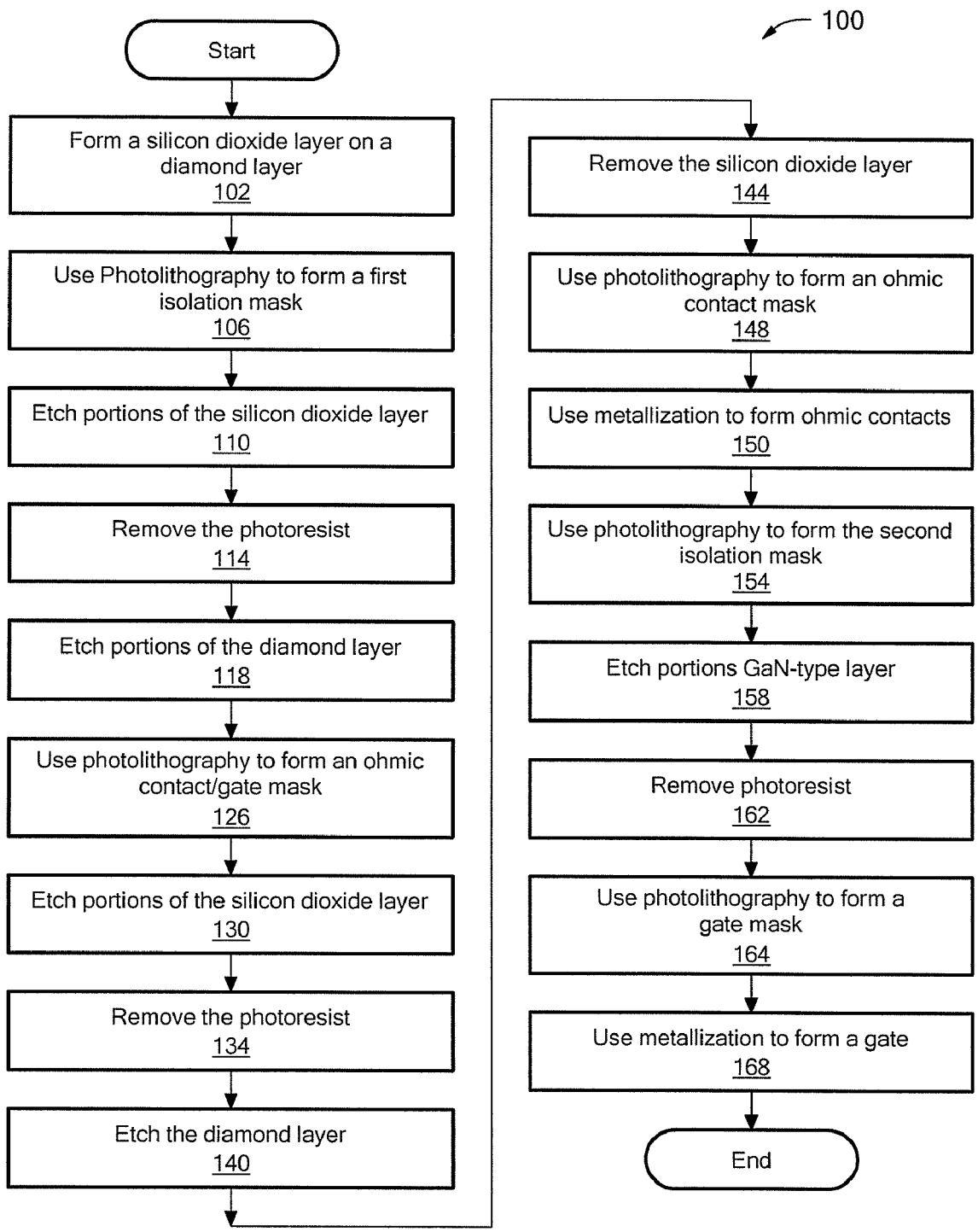
FIG. 3 is a flowchart of another example of a process to fabricate the device with the diamond layer.
Figure 4A:
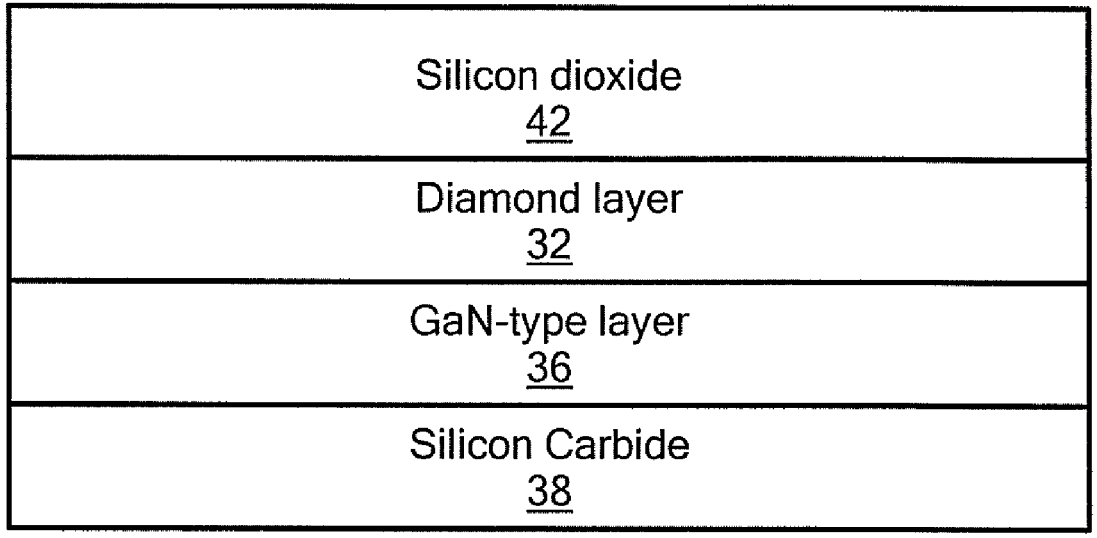
FIGS. 4A to 4N are diagrams corresponding to the process of FIG. 3.
Figure 4B:
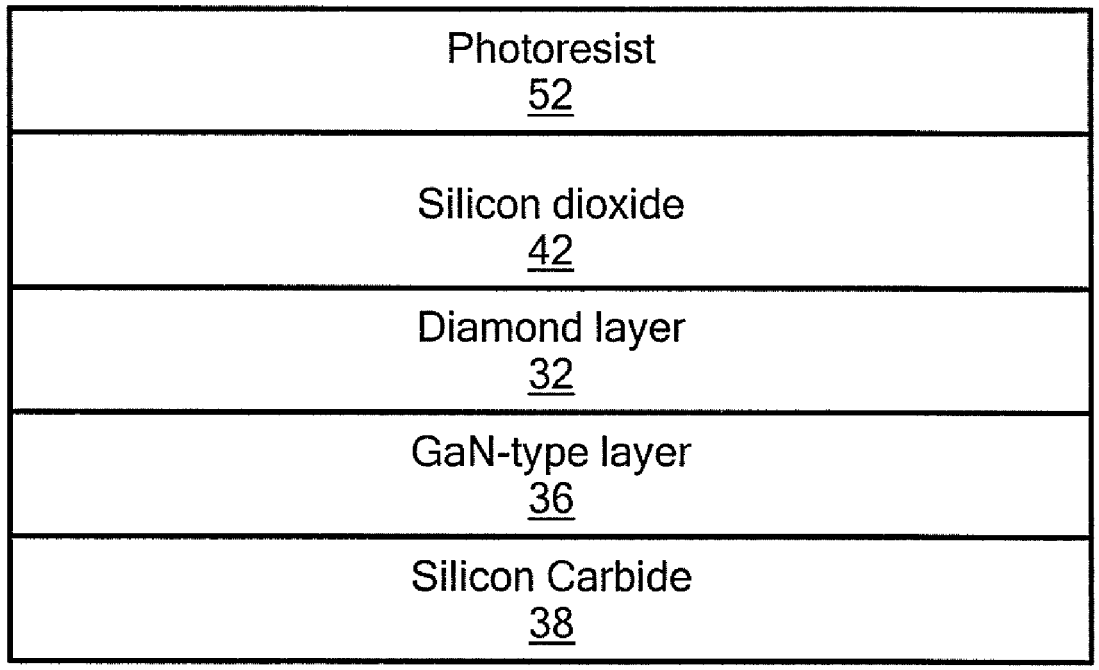
Figure 4C:
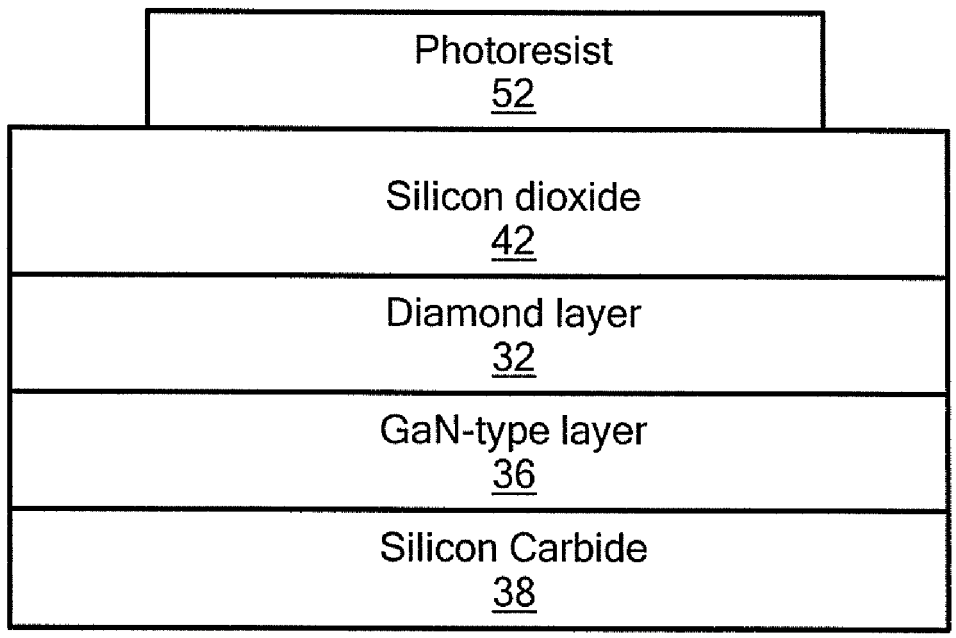
Figure 4D:
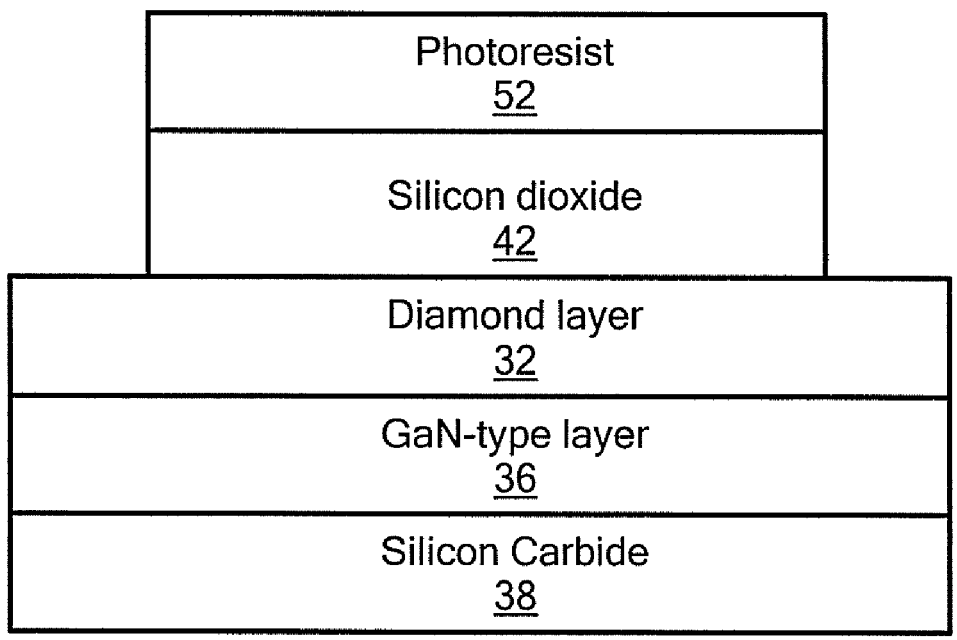
Figure 4E:
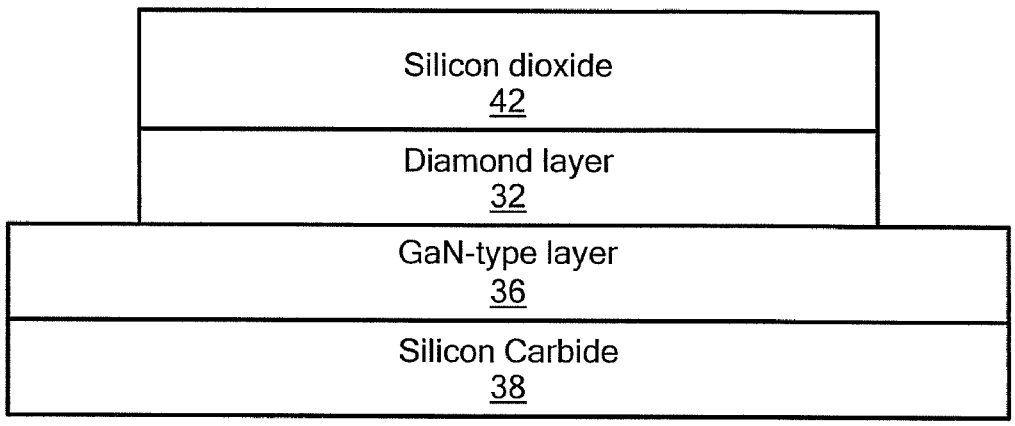
Figure 4F:
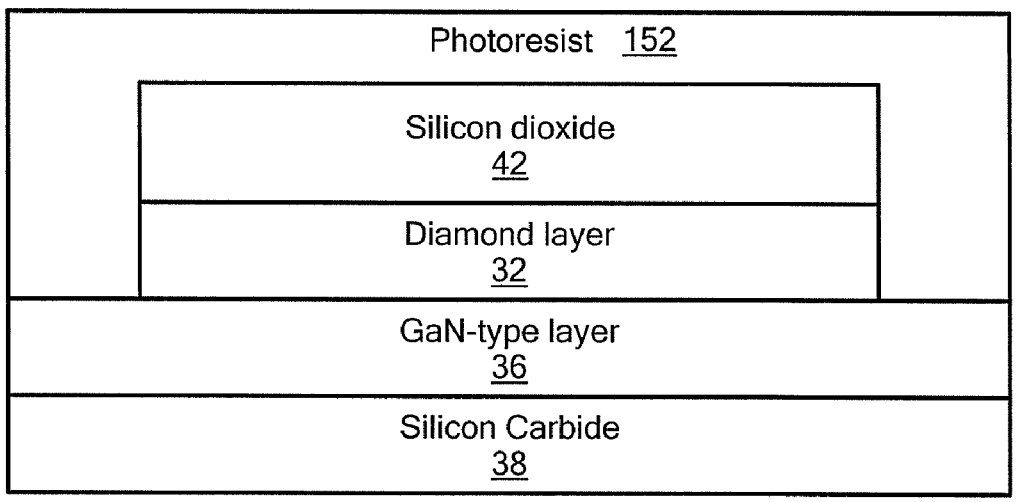
Figure 4G:
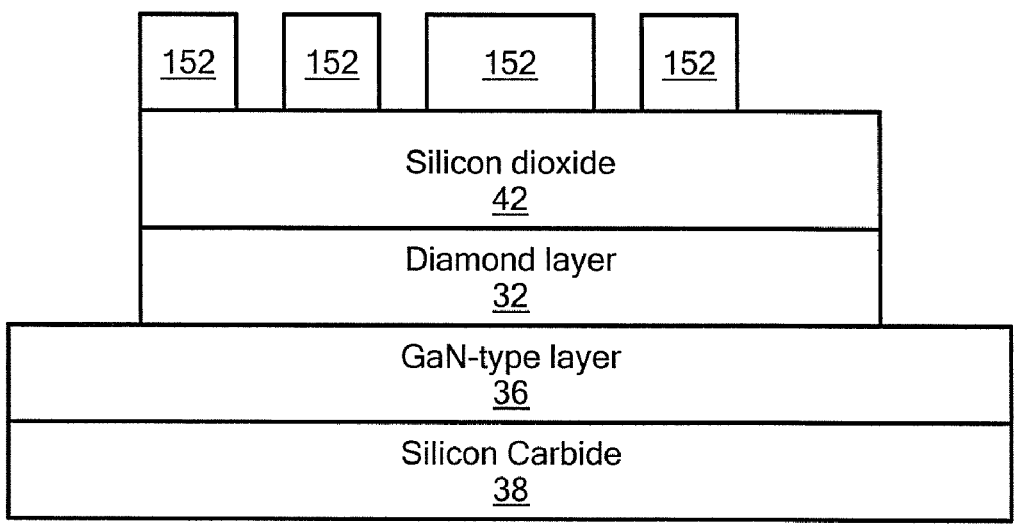
Figure 4H:
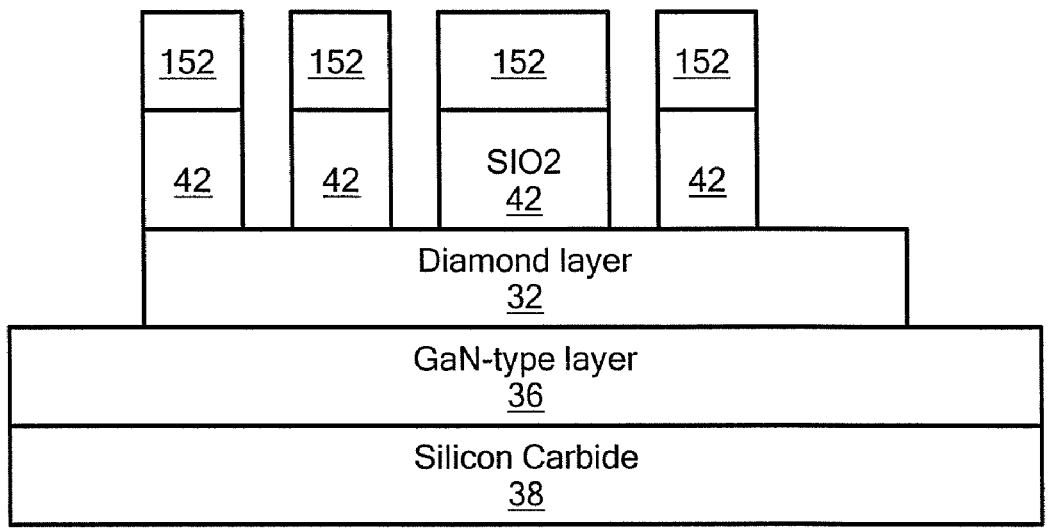
Figure 4I:
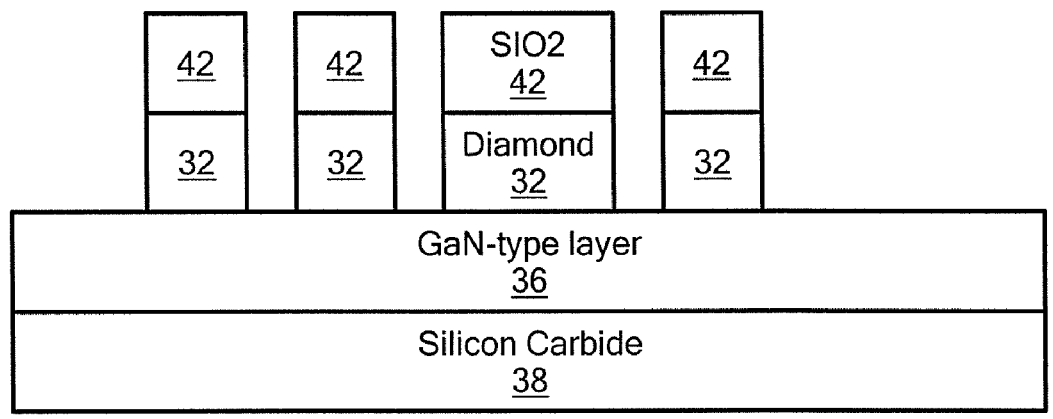
Figure 4J:
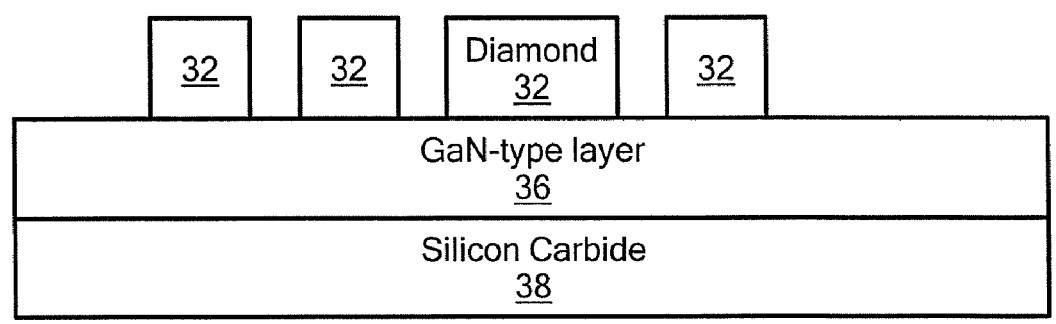
Figure 4K:
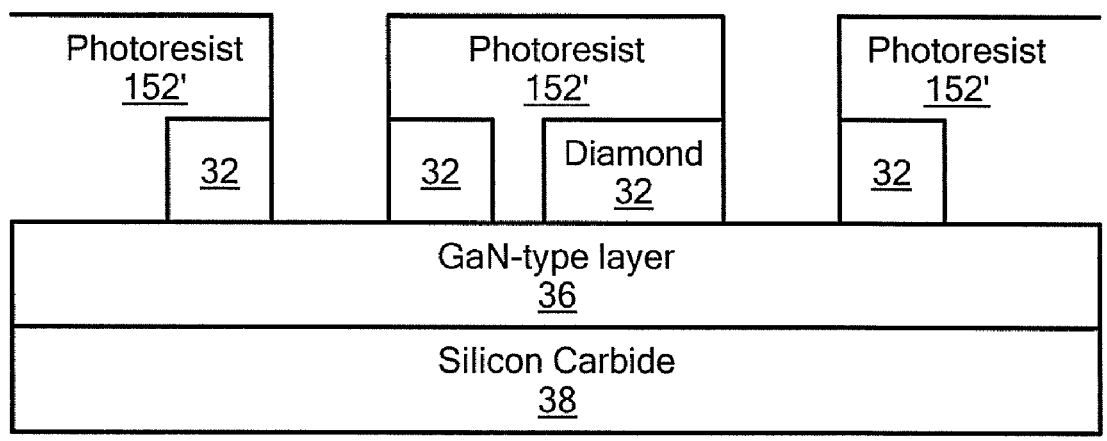
Figure 4L:
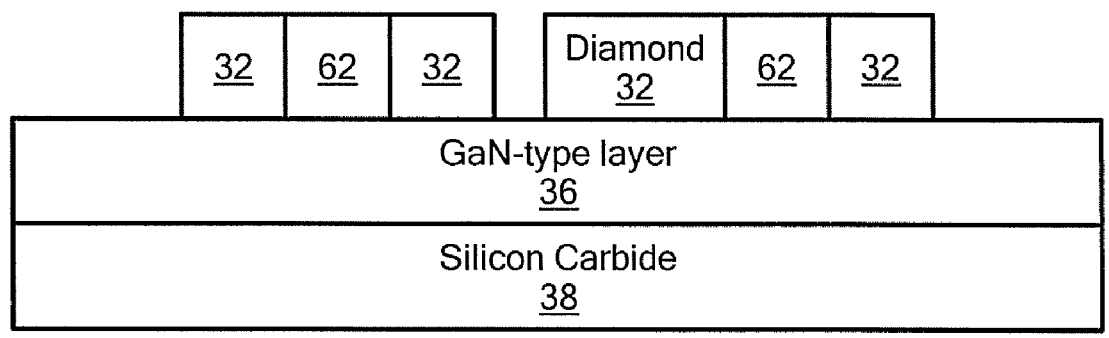
Figure 4M:
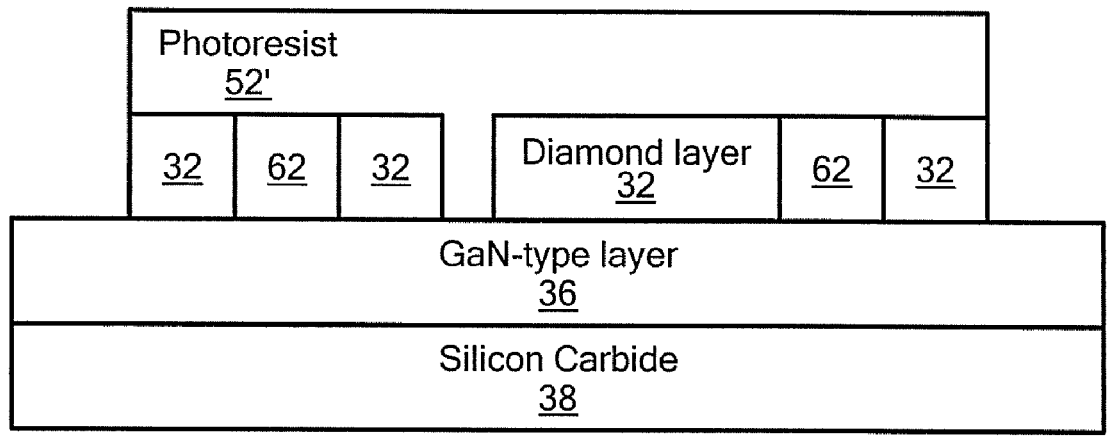
Figure 4N:
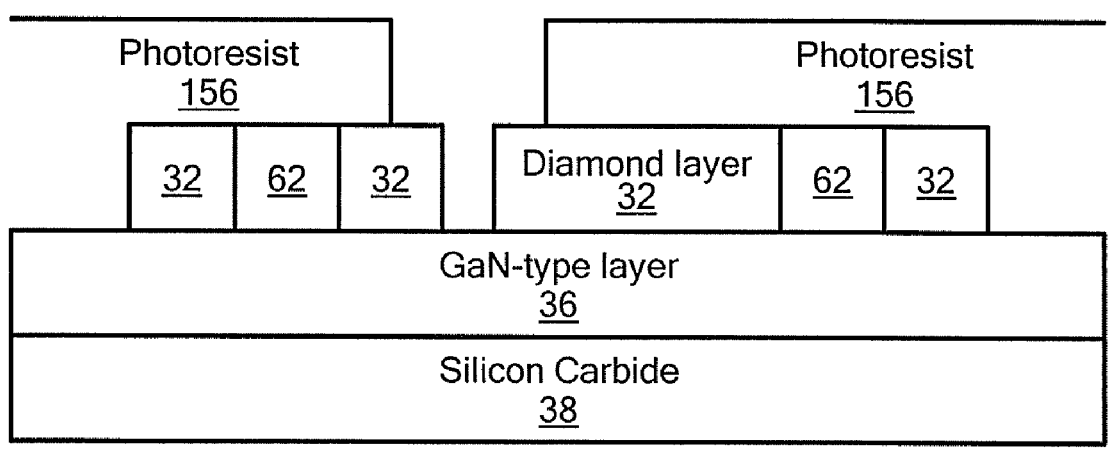

Referring to FIGS. 3 and 4A to 4N, another process to fabricate the device 60 is the process 100. The silicon dioxide layer 42 is formed on the diamond layer 32 (102) (FIG. 4A). Photolithography is used to form a first isolation mask (106). For example, the photoresist 52 is deposited onto the silicon dioxide layer 42 (FIG. 4B) and portions of the photoresist 52 are removed to form the first isolation mask using photolithography (FIG. 4C). Portions of the silicon dioxide layer 42 not covered by the photoresist 52 are etched (110) (FIG. 4D). The photoresist 52 is removed (114) and portions of the diamond layer 32 not covered by the silicon dioxide layer 42 are etched (118) (FIG. 4E) using, for example, the ICP process using an oxygen mixture or an oxygen and argon mixture.

A photolithographic process is used to form an ohmic contact/gate mask (126). For example, photoresist 152 is deposited on the silicon dioxide layer 42 (FIG. 4F) and using photolithography, portions of the photoresist 152 are removed to form the ohmic contact/gate mask (FIG. 4G). As will be described, the ohmic contact/gate mask is used to form the ohmic contacts 62 and the gate 66 along with a subsequent use of a gate mask and an ohmic contact mask.

Portions of the silicon dioxide layer 42 not covered by the photoresist 152 are etched (130) (FIG. 4H). The photoresist 152 is removed (134) and portions of the diamond layer 32 not covered by the silicon dioxide layer 42 are etched (140) (FIG. 4I) using, for example, the ICP process using an oxygen mixture or an oxygen and argon mixture. In one example, etching the diamond and into the GaN-type layer 36 may be desired so that an addition processing block (not shown) to the process 100 may also include an ICP etch using a chlorine mixture. The silicon dioxide layer 42 is removed (144) (FIG. 4J).

Photolithography is used to form an ohmic mask using photoresist 152' (148) (FIG. 4K). Metallization is used to deposit metal onto the GaN-type layer 36 not covered by the photoresist 152' to form the ohmic contacts 62 (150) (FIG. 4L). In one example, the metallization process includes depositing a metal, liftoff of the metal which includes removal of the photoresist 152' and annealing the metal.

Photolithography is used to form a second isolation mask using photoresist 52' (154) (FIG. 4M). Portions of the GaN-type layer 36 not covered by the photoresist 52' are etched (158) (FIG. 4M). For example, the GaN-type layer 36 is etched using, for example, the ICP process using a chlorine gas mixture for 1 minute and 40 seconds. The photoresist 52' is removed (162) and using a photolithographic process a gate mask is formed using photoresist 156 (164) (FIG. 4N). A metallization process is used to form the gate 66 (168) (FIG. 2H).

Figure 5:
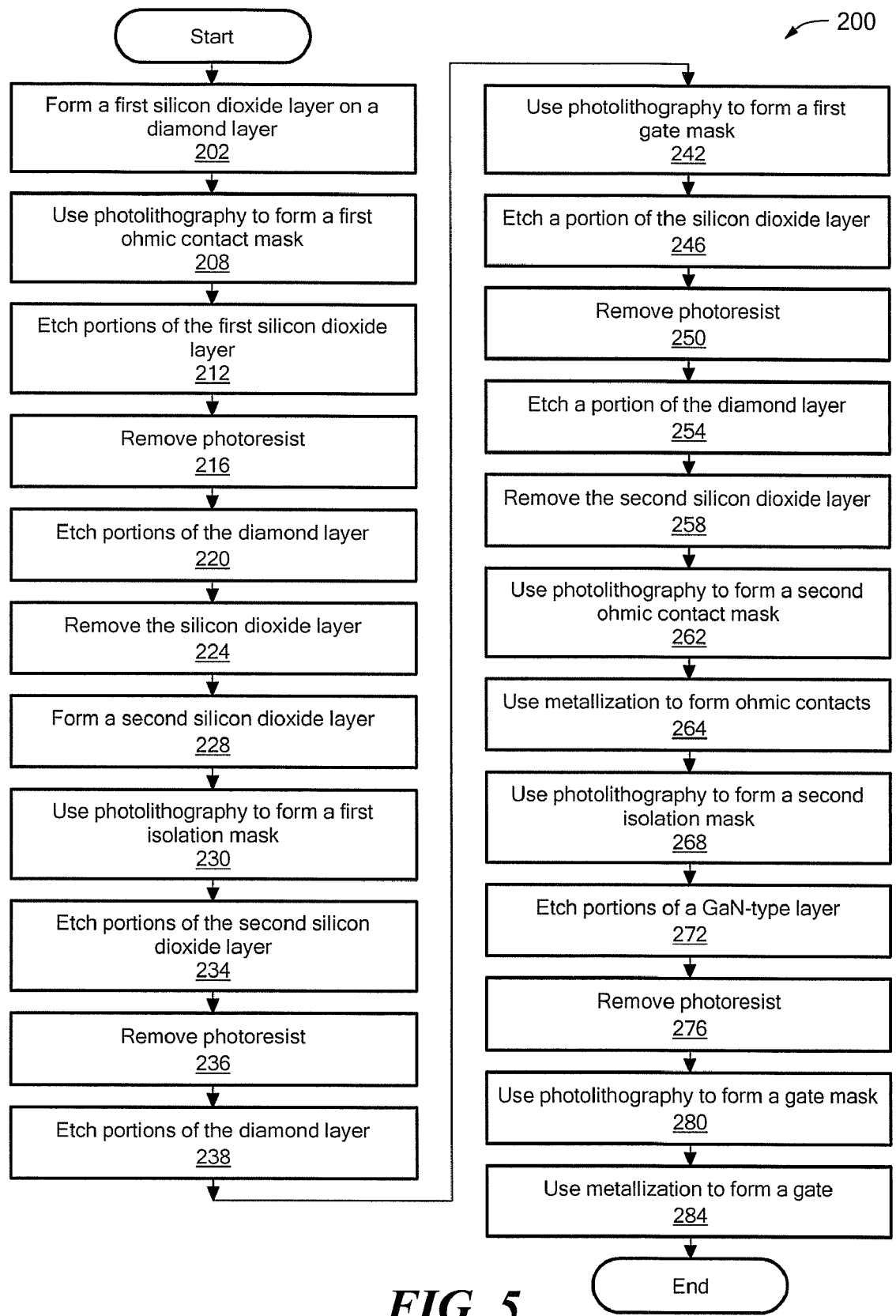
FIG. 5 is a flowchart of a further example of a process to fabricate the device with the diamond layer.
Figure 6A:
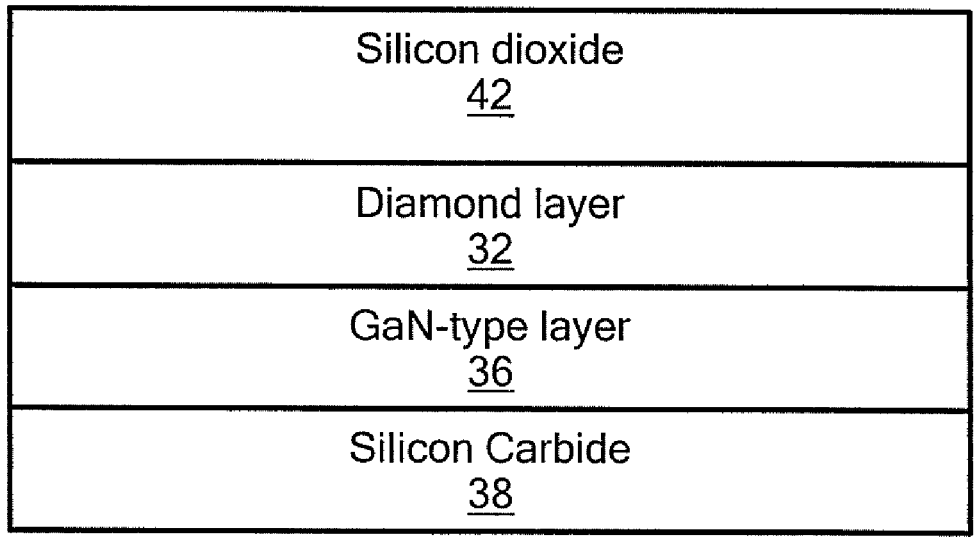
FIGS. 6A to 6R are diagrams corresponding to the process of FIG. 5.
Figure 6B:
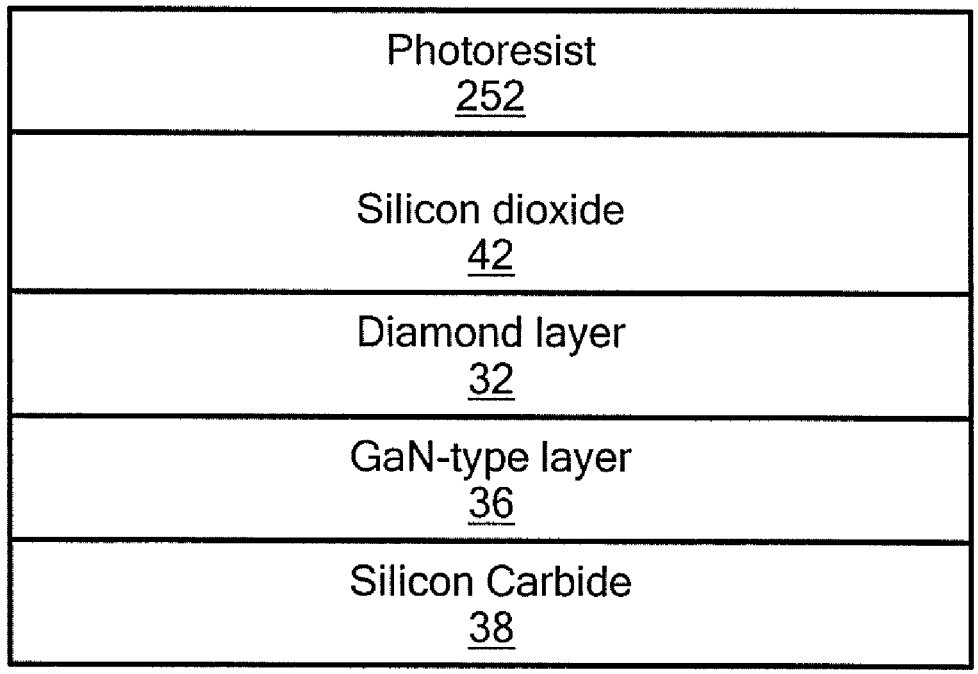
Figure 6C:
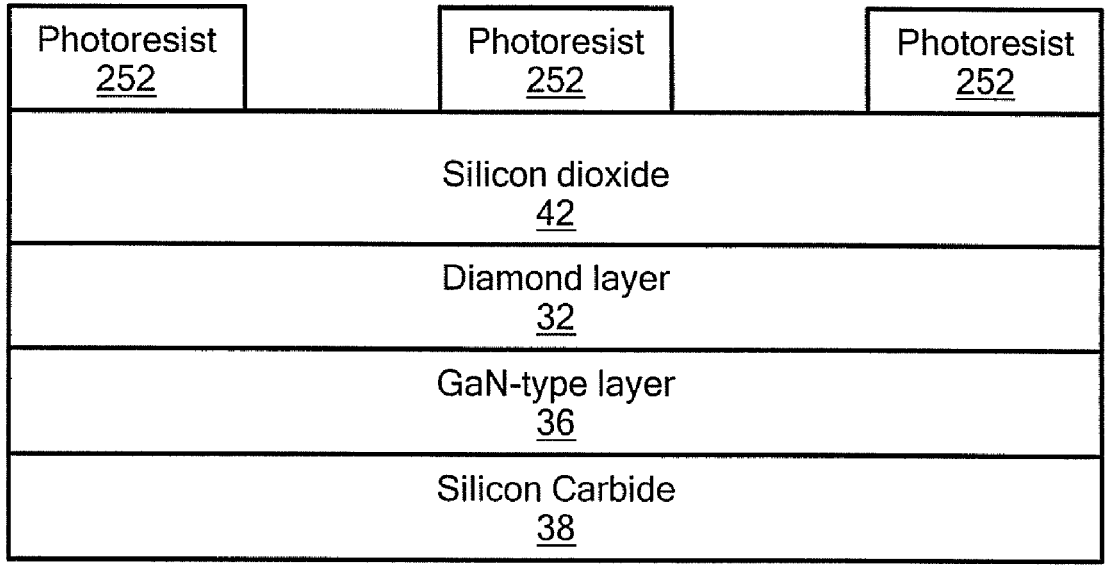
Figure 6D:
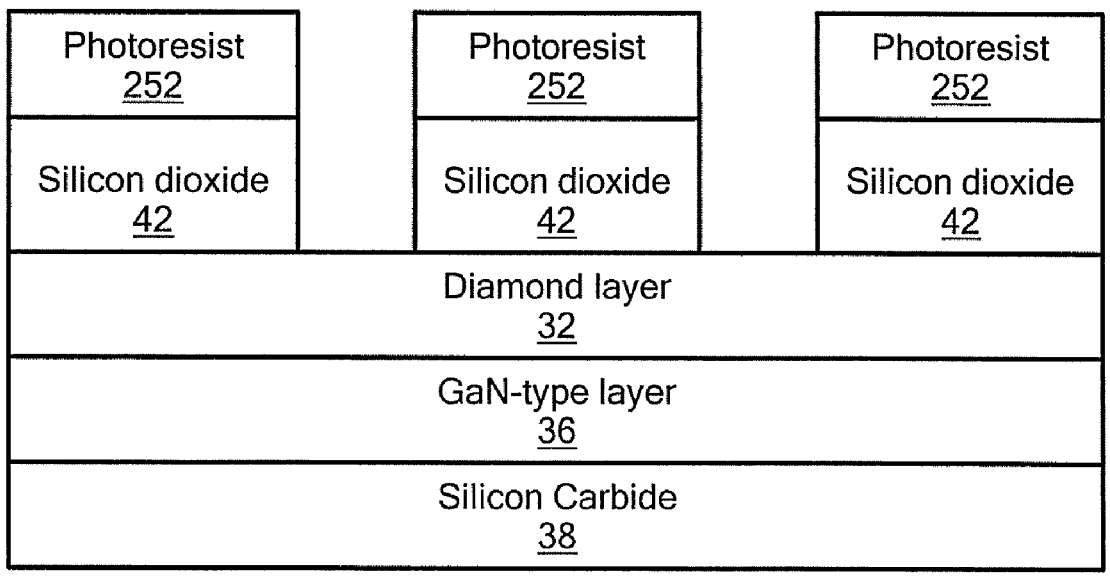
Figure 6E:
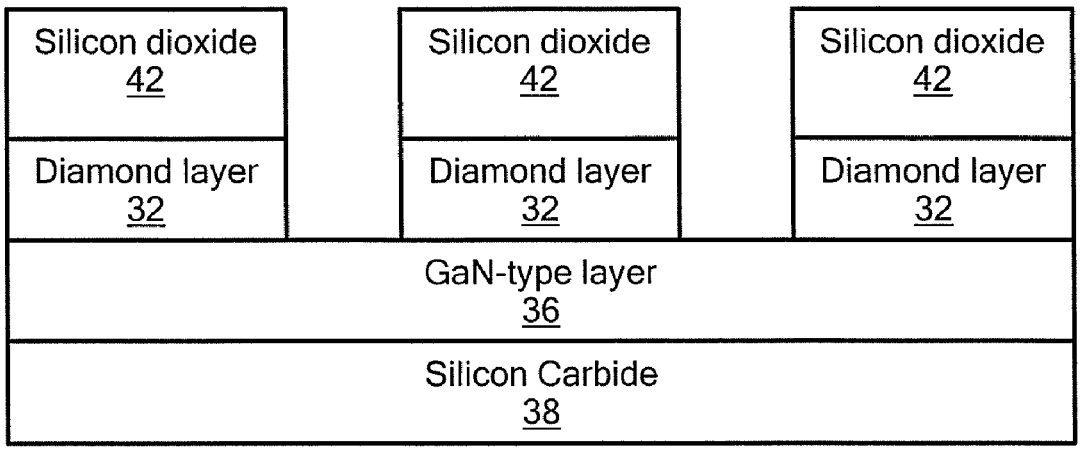
Figure 6F:
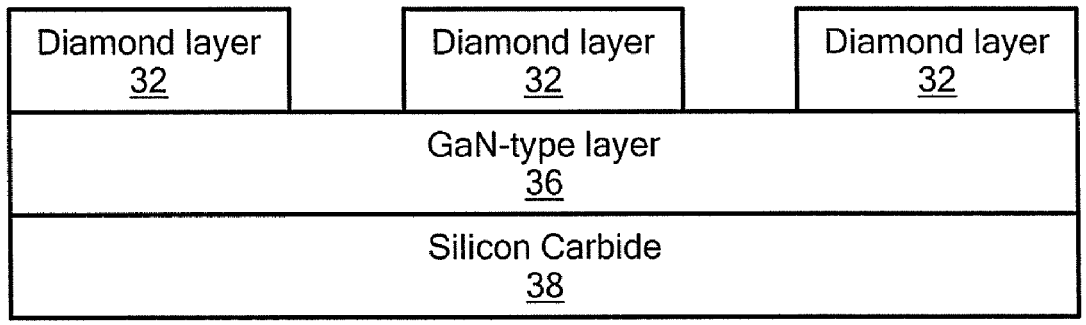
Figure 6G:
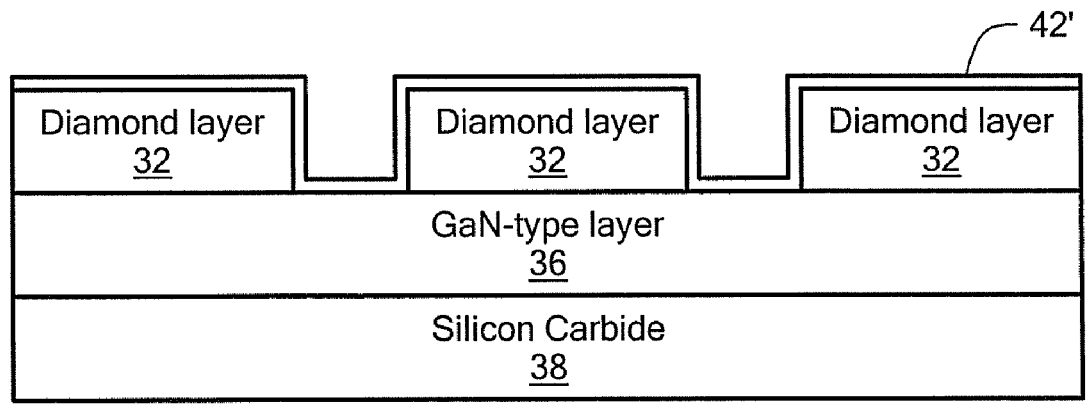
Figure 6H:
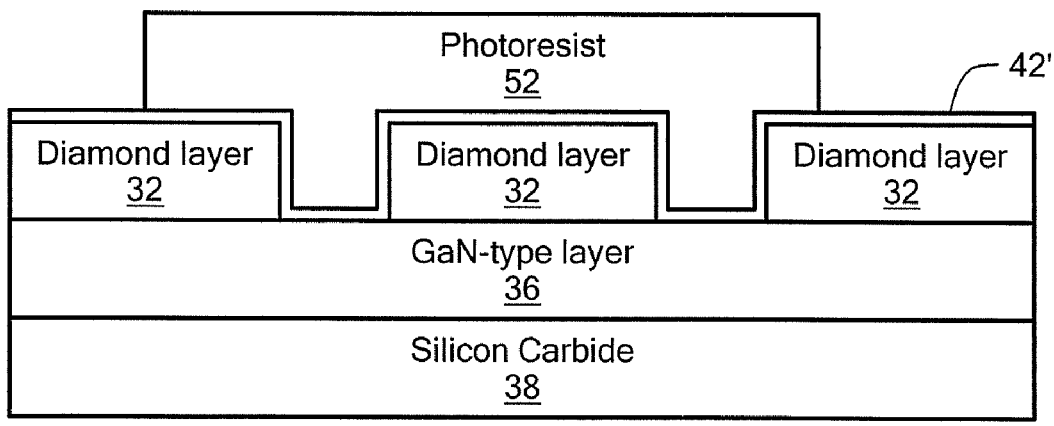
Figure 6I:
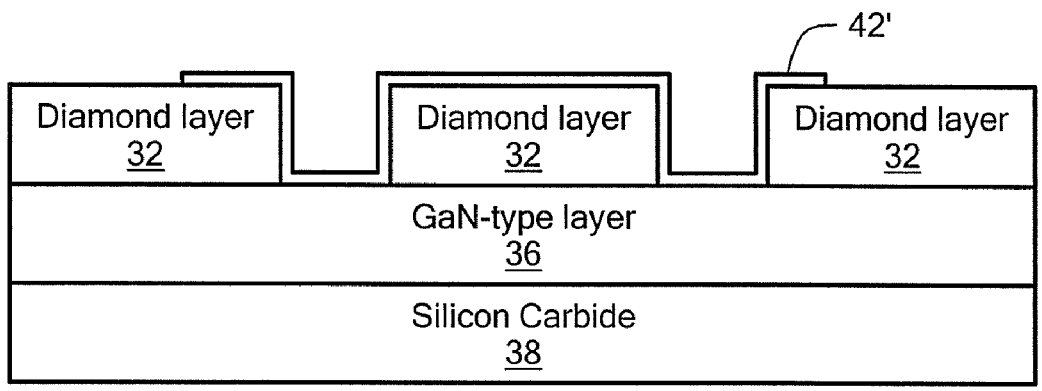
Figure 6J:
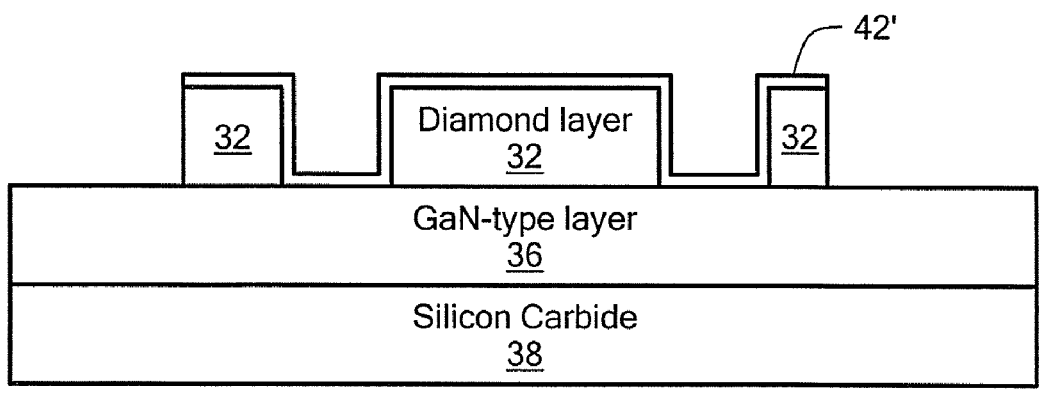
Figure 6K:
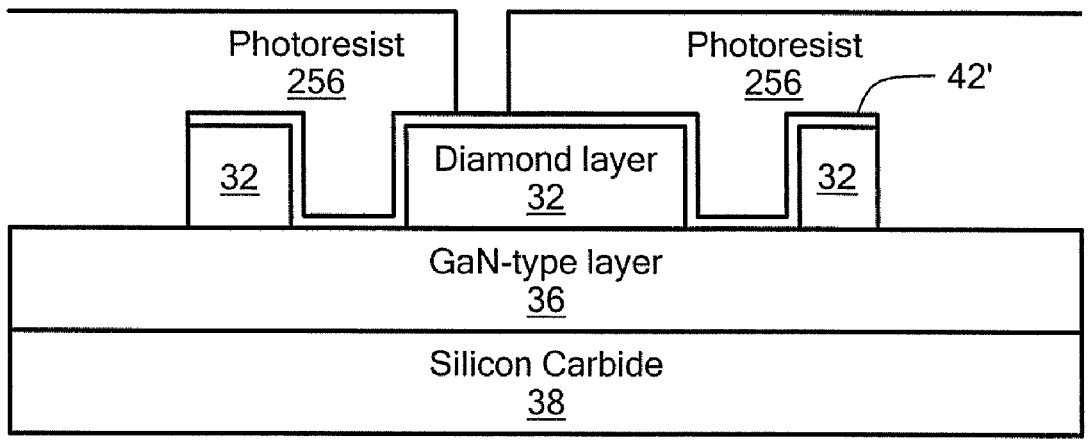
Figure 6L:
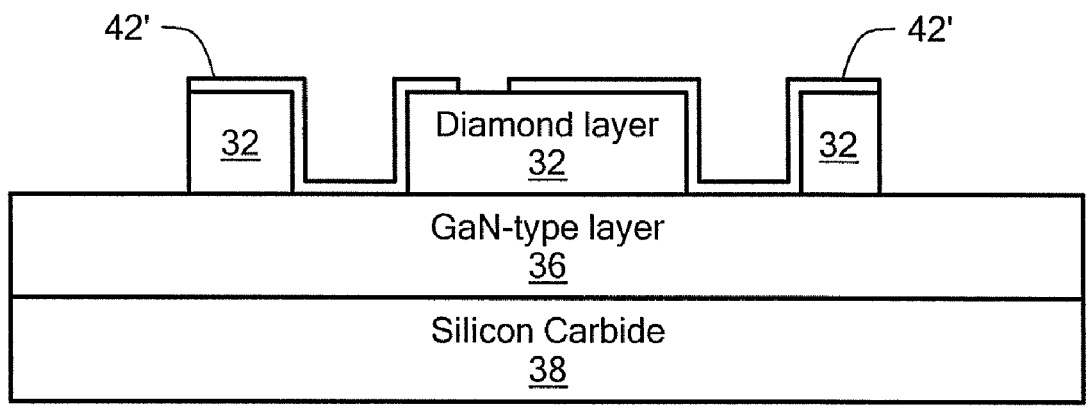
Figure 6M:
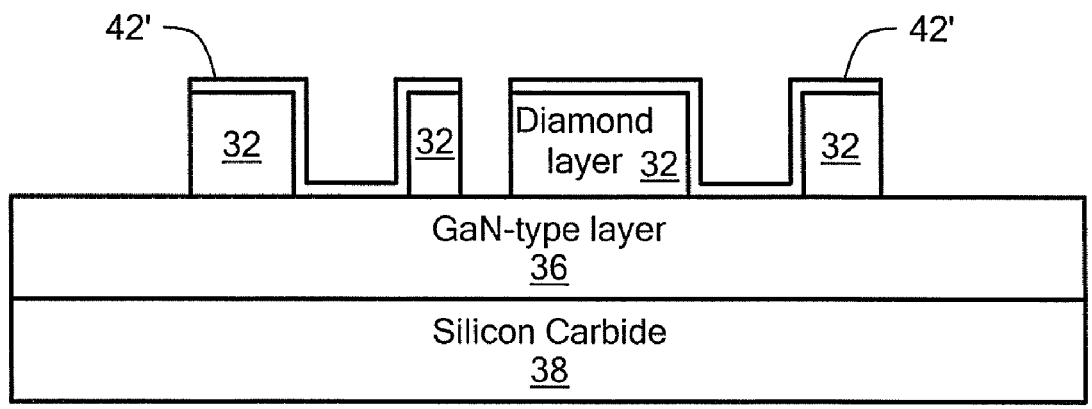
Figure 6N:
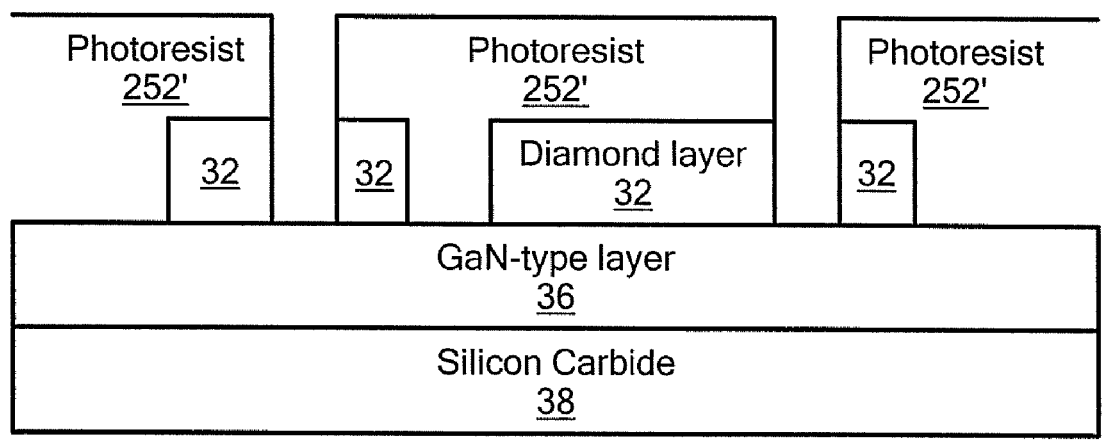
Figure 6O:
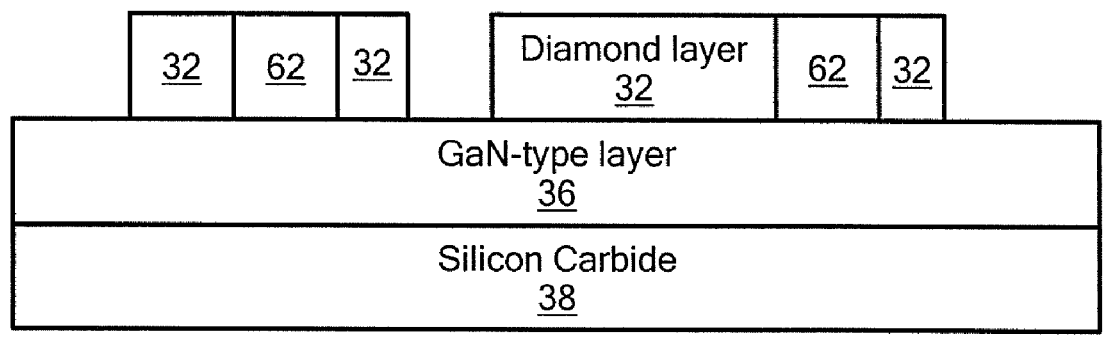
Figure 6P:
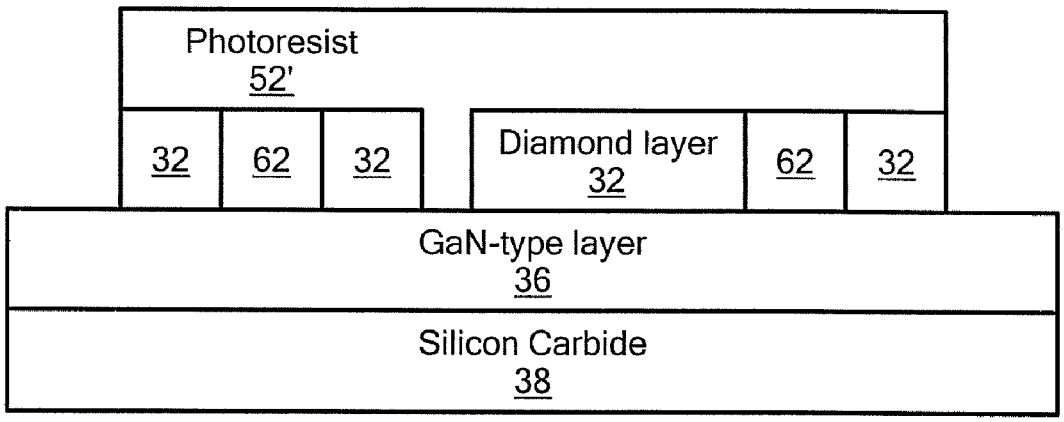
Figure 6Q:
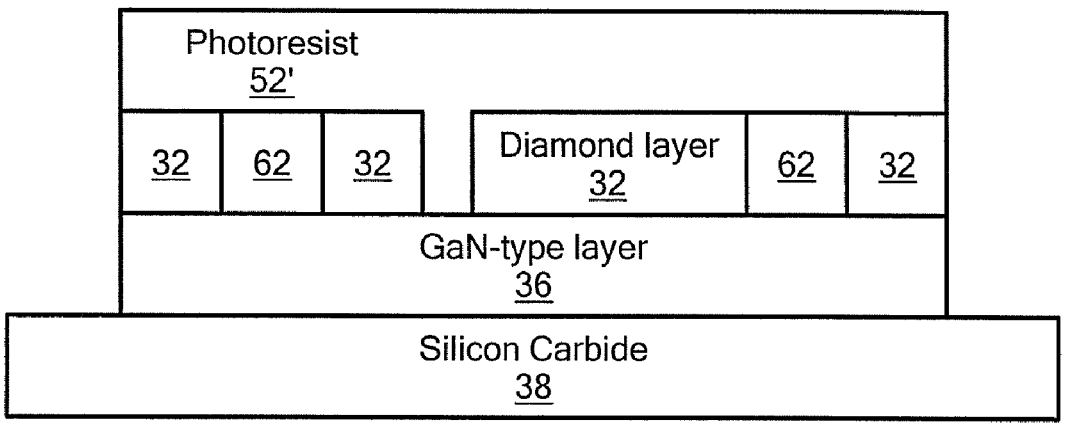
Figure 6R:
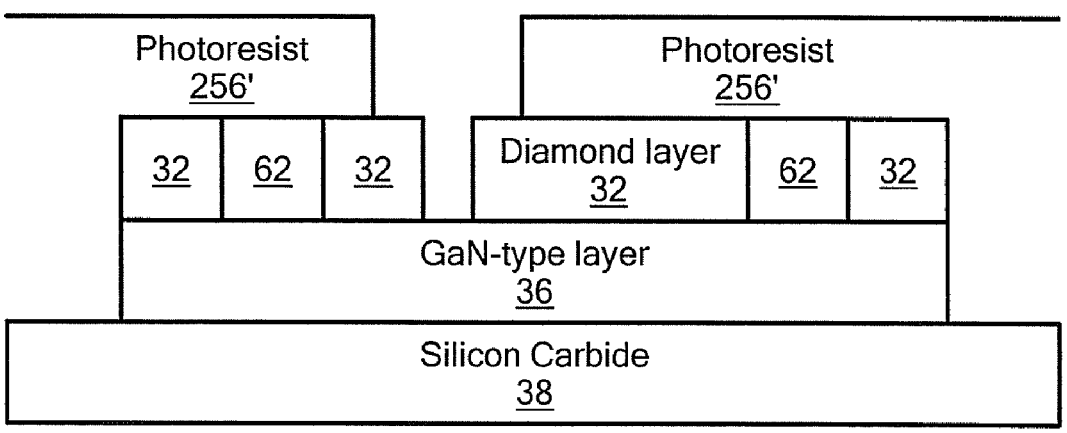
Figure 7:
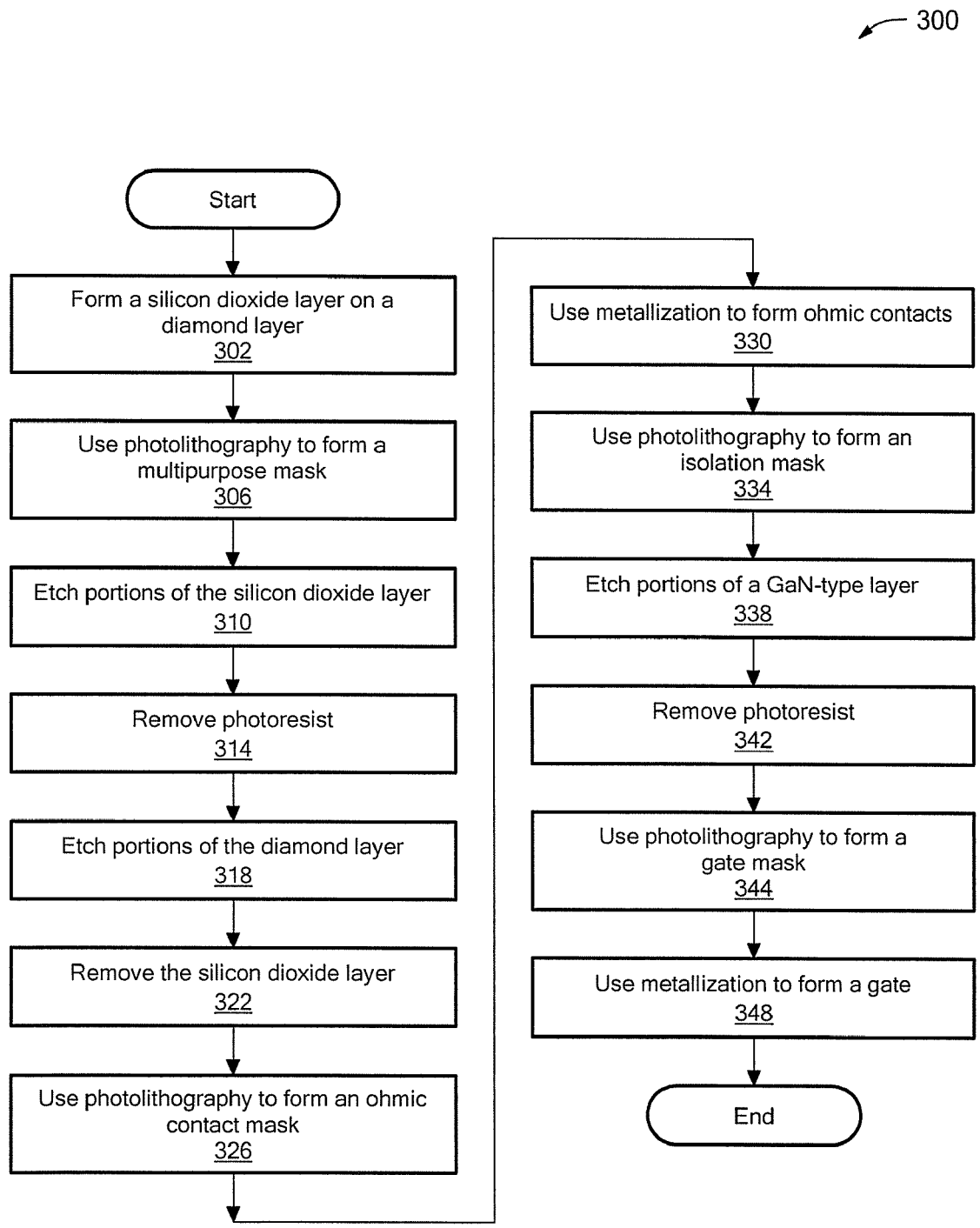
FIG. 7 is a flowchart of a still further example of a process to fabricate the device with the diamond layer.

Referring to FIGS. 5 and 6A to 6R, another process to fabricate the device 60 is the process 200. A first silicon dioxide layer 42 is formed on the diamond layer 32 (202) (FIG. 6A). Photolithography is used to form an ohmic contact mask (208). For example, a photoresist 252 is deposited onto the silicon dioxide 42 (FIG. 6B) and the ohmic contact mask is formed (FIG. 6C). Portions of the first silicon dioxide 42 not covered by the photoresist 252 are etched (212) (FIG. 6D). The photoresist 252 is removed (216) and portions of the diamond layer 32 not covered by the first silicon dioxide 42 are etched (220) (FIG. 6E) using, for example, the ICP process using an oxygen mixture or an oxygen and argon mixture. The first silicon dioxide layer 42 is removed (224) (FIG. 6F). In one example, the first silicon dioxide 42 is removed using an HF based solution (e.g., hydrofluoric acid).

A second silicon dioxide layer 42' is deposited (228) (FIG. 6G). In one example, the second dioxide layer 42' is deposited using PECVD. In one example, the thickness of the second silicon dioxide layer 42' is 1,000 Angstroms. A photolithographic process is used to form an isolation mask (230). For example, photoresist 52 is deposited onto the second silicon dioxide layer 42' and using photolithography, the photoresist 52 forms the isolation mask (FIG. 6H).

Positions of the second silicon dioxide 42' not covered by the photoresist 52 are etched (234) (FIG. 6I). The photoresist 52 is removed (236) (FIG. 6I) and portions of the diamond layer 32 not covered by the second silicon dioxide layer 42' are etched (238) (FIG. 6J) using, for example, the ICP process using an oxygen mixture or an oxygen and argon mixture. In one example, the photoresist 52 is thinned prior to removal.

Using a photolithographic process a gate mask is foiled using photoresist 256 (242) (FIG. 6K). A portion of the second silicon dioxide layer 42' not covered by the photoresist 256 is etched (246) and the photoresist 256 is removed (250) (FIG. 6L). A portion of the diamond layer 32 not covered by the second silicon dioxide 42' is etched (254) (FIG. 6M) using, for example, the ICP process using an oxygen mixture or an oxygen and argon mixture. The second silicon dioxide layer 42' is removed (258). In one example, the silicon dioxide 42' is removed using an HF based solution (e.g., hydrofluoric acid). A photolithographic process is used to form a second ohmic contact mask using photoresist 252' (262) (FIG. 6N). In one example, etching into the GaN-type layer 36 may be desired so that an addition processing block (not shown) in the process 200 may also include an ICP etch using a chlorine mixture. In one example, the etch into the GaN-type layer 36 is 100 Angstroms.

Using a metallization process, the ohmic contacts 32 are formed (264) (FIG. 6O). In one example, the metallization process includes depositing a metal, liftoff of the metal which includes removal of the photoresist 252' and annealing the metal.

A photolithographic process is used to form a second isolation mask using photoresist 52' (268) (FIG. 6P). Portions of the GaN-type layer 36 not covered by the photoresist 52' are etched (272) (FIG. 6Q). For example, the GaN-type layer 36 is etched using, for example, the ICP process using a chlorine gas mixture for 1 minute and 40 seconds. The photoresist 52' is removed (276) and a photolithographic process is used to form a second gate mask using photoresist 256' (262) (FIG. 6R). Using a metallization process, the gate 66 is formed (284) (FIG. 2H).

Figure 8A:
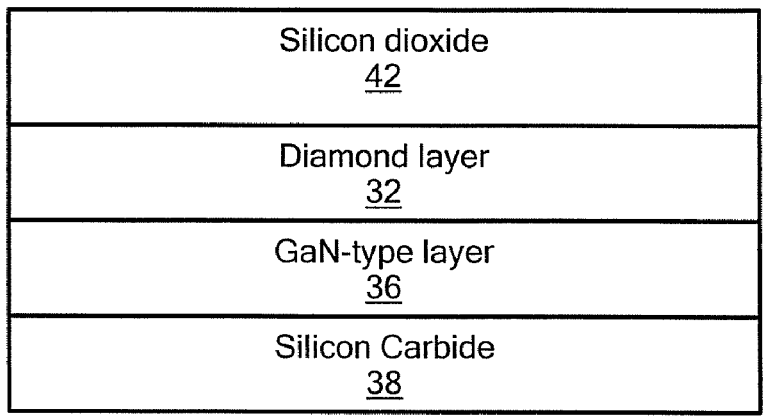
FIGS. 8A to 8K are diagrams corresponding to the process of FIG. 7.
Figure 8B:
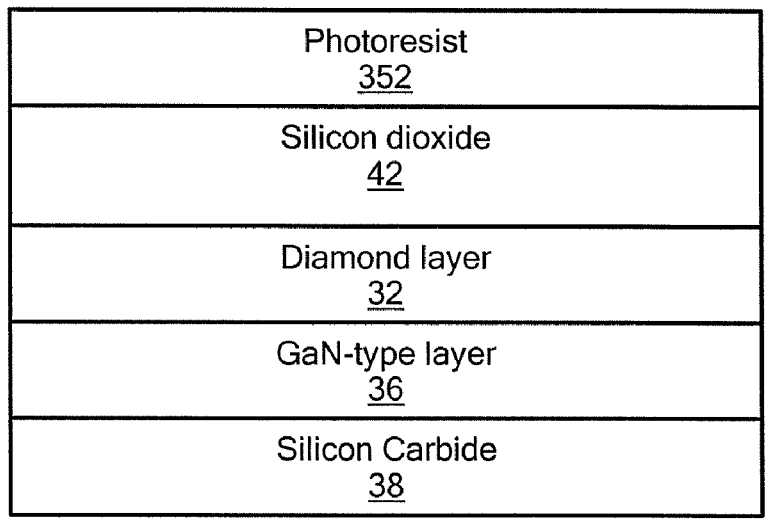
Figure 8C:
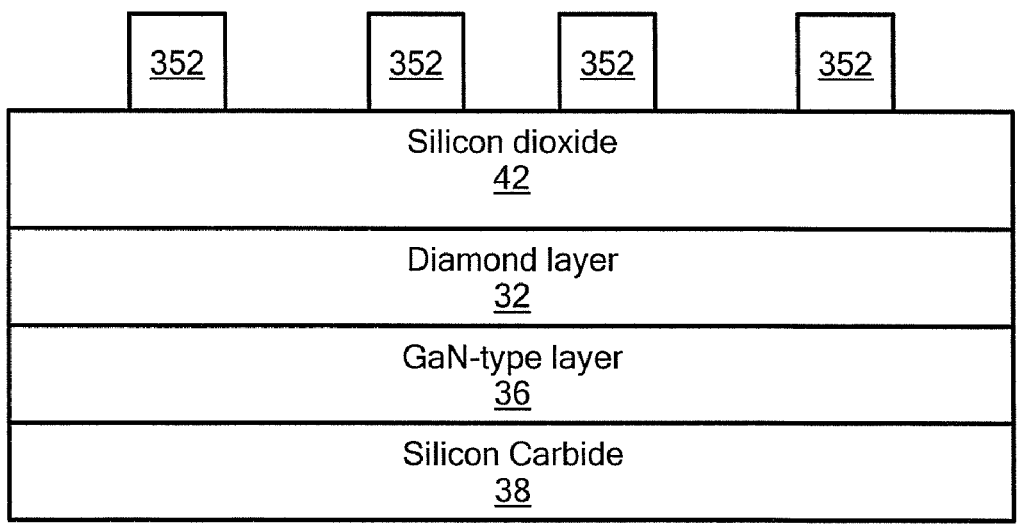
Figure 8D:
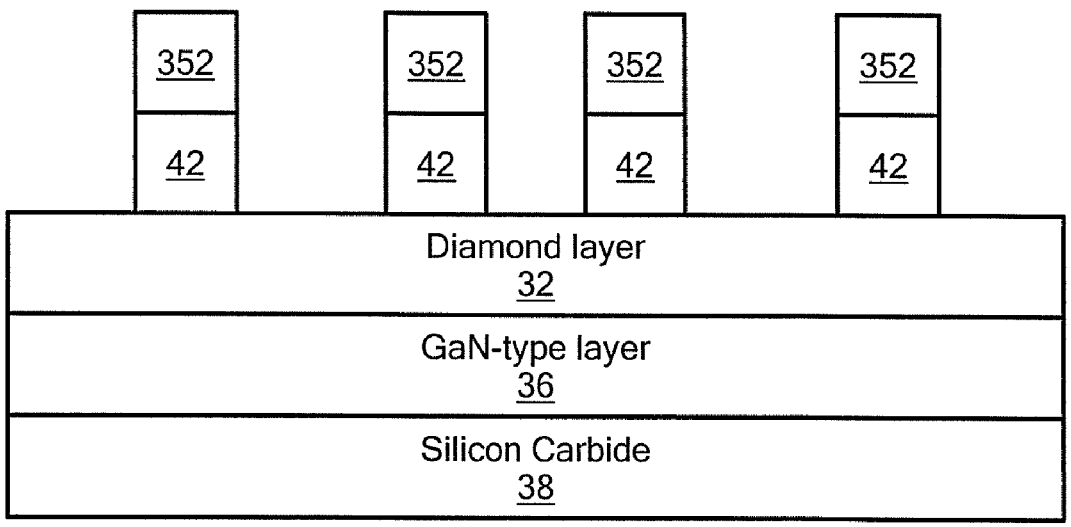
Figure 8E:
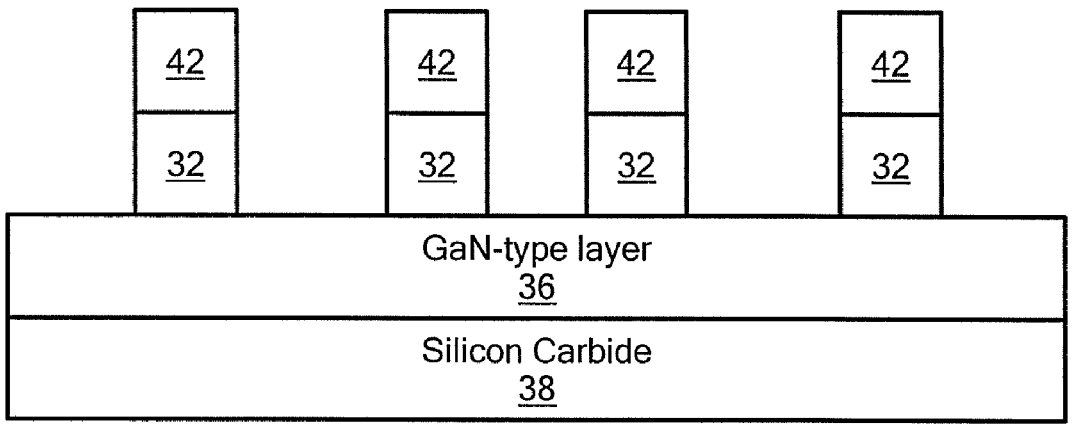
Figure 8F:
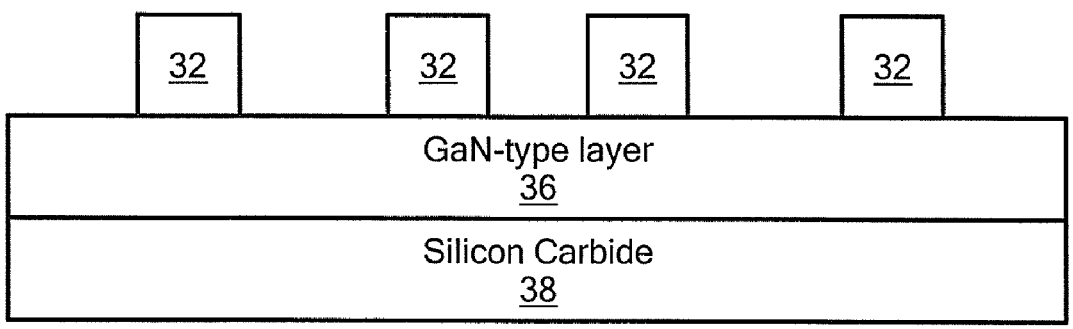

Referring to FIGS. 7 and 8A to 8K, another process to fabricate the device 60 is the process 300. Silicon dioxide 42 is formed on the diamond layer 32 (302) (FIG. 8A). Photolithography is used to form a multipurpose mask (306). For example, photoresist 352 is deposited onto the silicon dioxide 42 (FIG. 8B) and the multipurpose mask is formed (FIG. 8C). The multipurpose mask is a preprocessing mask for subsequent ohmic, isolation and gate mask processing. Portions of the silicon dioxide 42 not covered by the photoresist 352 are etched (310) (FIG. 8D). The photoresist 352 is removed (314) and portions of the diamond layer 32 not covered by the silicon dioxide 42 are etched (318) (FIG. 8E) using, for example, the ICP process using an oxygen mixture or an oxygen and argon mixture. The silicon dioxide 42 is removed (322) (FIG. 8F).

Figure 8G:
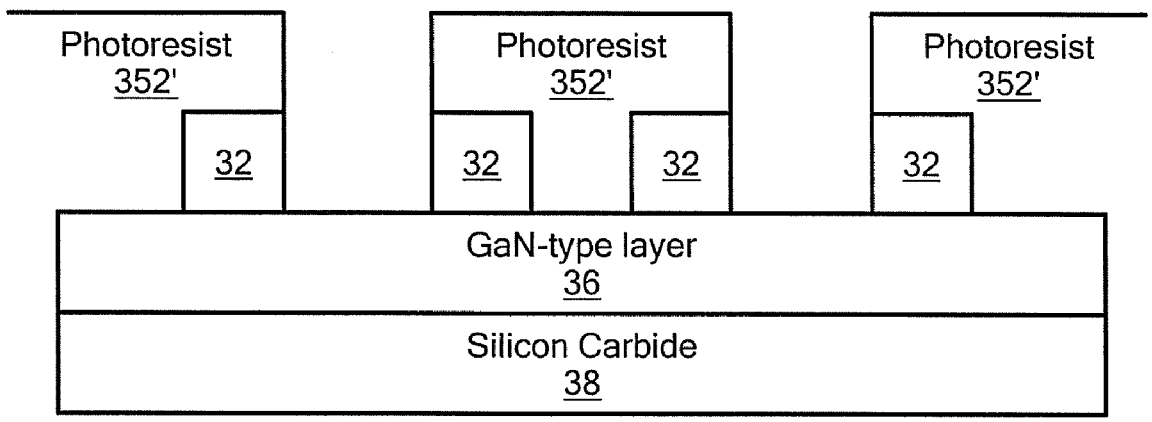
Figure 8H:
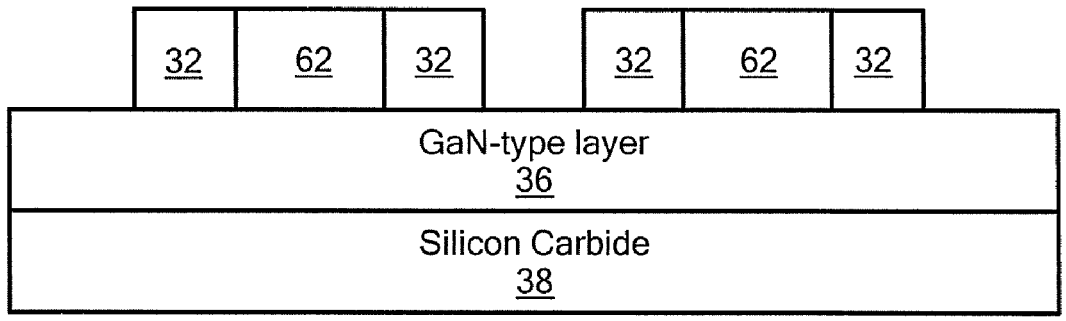

A photolithographic process is used to form an ohmic contact mask using photoresist 352' (326) (FIG. 8G). Using a metallization process, the ohmic contacts 62 are formed (330) (FIG. 8H). In one example, the metallization process includes depositing a metal, liftoff of the metal, which includes removal of the photoresist 352' and annealing the metal.

Figure 8I:
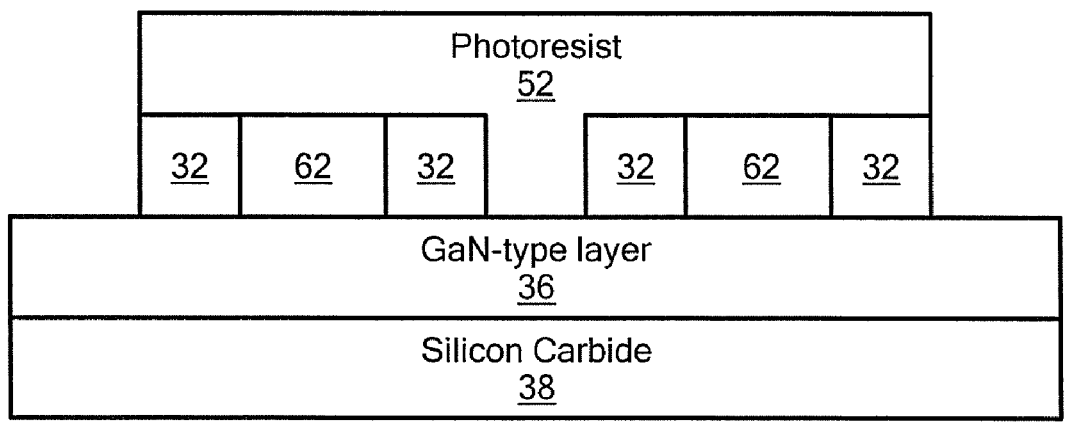
Figure 8J:
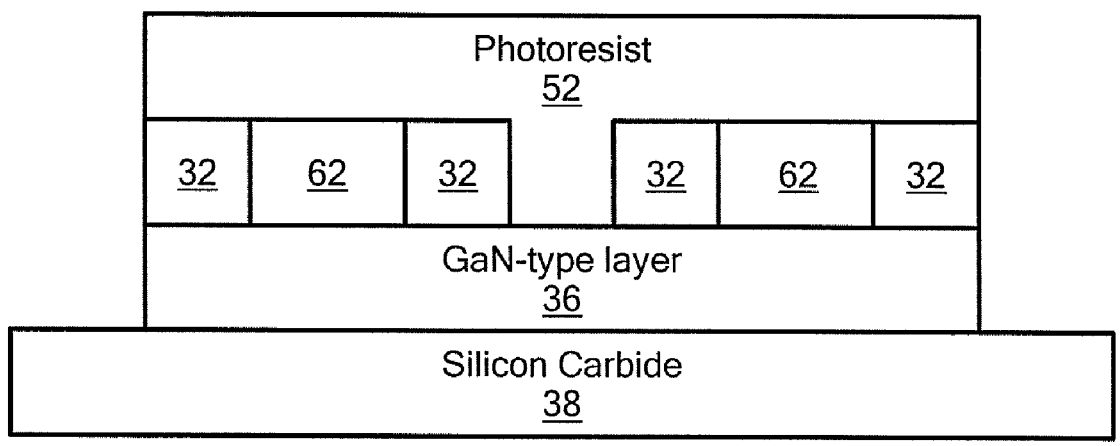
Figure 8K:
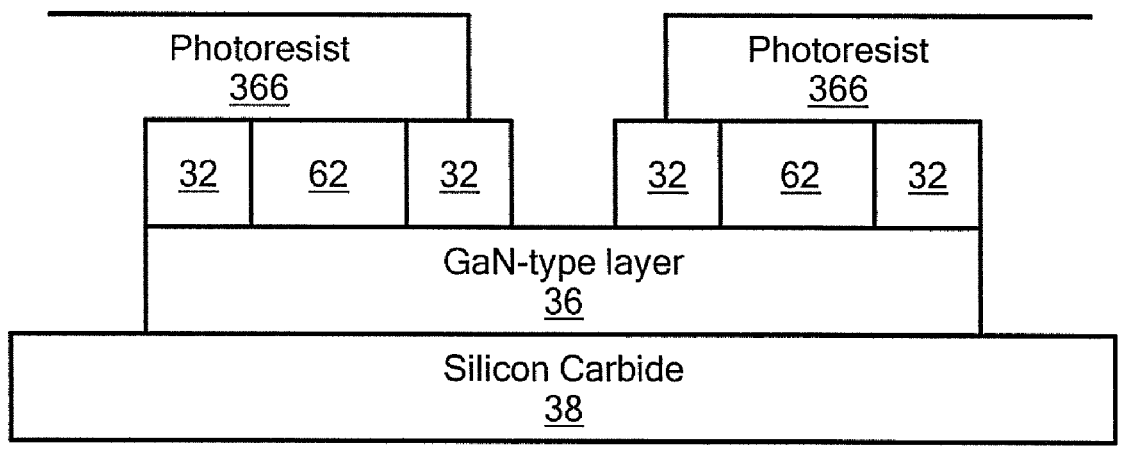

A photolithographic process is used to form an isolation contact mask using photoresist 52 (334) (FIG. 8I). Portions of the GaN-type layer 36 not covered by the photoresist 52 are etched (338) (FIG. 8J). For example, the GaN-type layer 36 is etched using, for example, the ICP process using a chlorine gas mixture for 1 minute and 40 seconds. The photoresist 52 is removed (342) and a photolithographic process is used to form a gate mask using photoresist 366 (344) (FIG. 8K). Using a metallization process, the gate 66 is formed (348) (FIG. 2H).

Figure 9A:
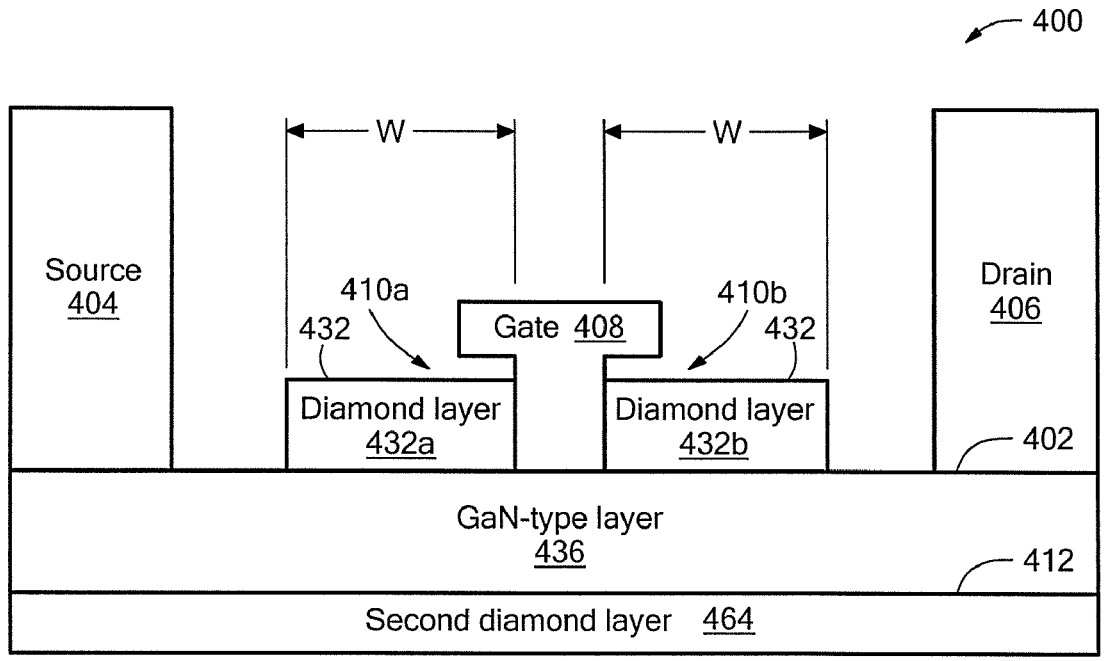
FIGS. 9A and 9B are examples of a high electron mobility transistor (HEMT) device with diamond layers.

Referring to FIG. 9A, one example of the device 60 is a device 400. The device 400 includes a source 404, a drain 406 and a gate 408 (e.g., a T-Gate) that are formed using photolithographic and metallization processes that include depositing metal onto to a surface 402 of a GaN-type layer 436. The device also includes a second diamond layer 464 on a bottom surface 412 of the GaN-type layer 436.

The gate 408 is formed in a diamond layer 432 after removal of portions of the diamond layer 432 thereby exposing the GaN-type layer 436. In this example, the removal of portions of the diamond layer 432 splits the diamond layer into two diamond layers 432*a*, 432*b* each having a width W. In this configuration, the diamond layers 432*a*, 432*b* may function as a dielectric layer and a heat spreader by removing the heat away from the gate 408 and between the gate and the drain 406 significantly reducing temperatures at the gate 408. In some examples, the widths of the diamond layers 432*a*, 432*b* may not be equal. In one example, portions of the gate 408 are adjacent to and in contact with the diamond layers 432*a*, 432*b* and other portions of the gate 408 form gaps 410*a*, 410*b* (e.g., air gaps) between the gate 408 and the diamond layers 432*a*, 432*b*.

In one example, the device 400 may be a high frequency device, a high electron mobility transistor (HEMT) and/or a high power microwave device and so forth. For example, a diamond layer 432 may be integrated directly into the device 400 and used not only to remove heat but function as a dielectric, for example, as used in capacitance structures. For example, the dielectric constant of diamond is about 5.7 which is close to the dielectric constant of about 7 for silicon nitride films commonly used in GaN devices; however, diamond films have a greater thermal conductivity than the silicon nitride films.

In one example, the gate 408, the gaps 410*a*, 410*b*, the diamond layer 432*a*, 432*b* form capacitance structures. In other examples, other materials may fill gaps 410*a*, 410*b* that may or may not contribute to capacitance.

Figure 9B:
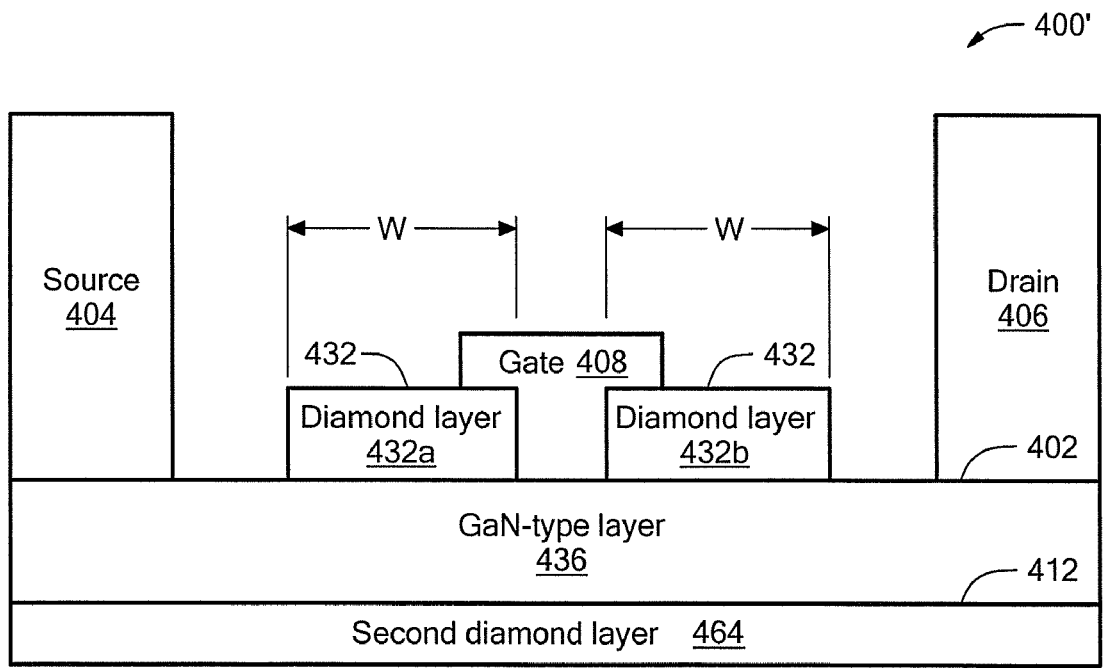

Referring to FIG. 9B, in still further examples, a device 400' does not include gaps 410*a*, 410*b* so that the gate 408 is directly on the surface of the diamond layers 432*a*, 432*b* thereby contributing to greater heat spreading away from the gate.

Figure 10:
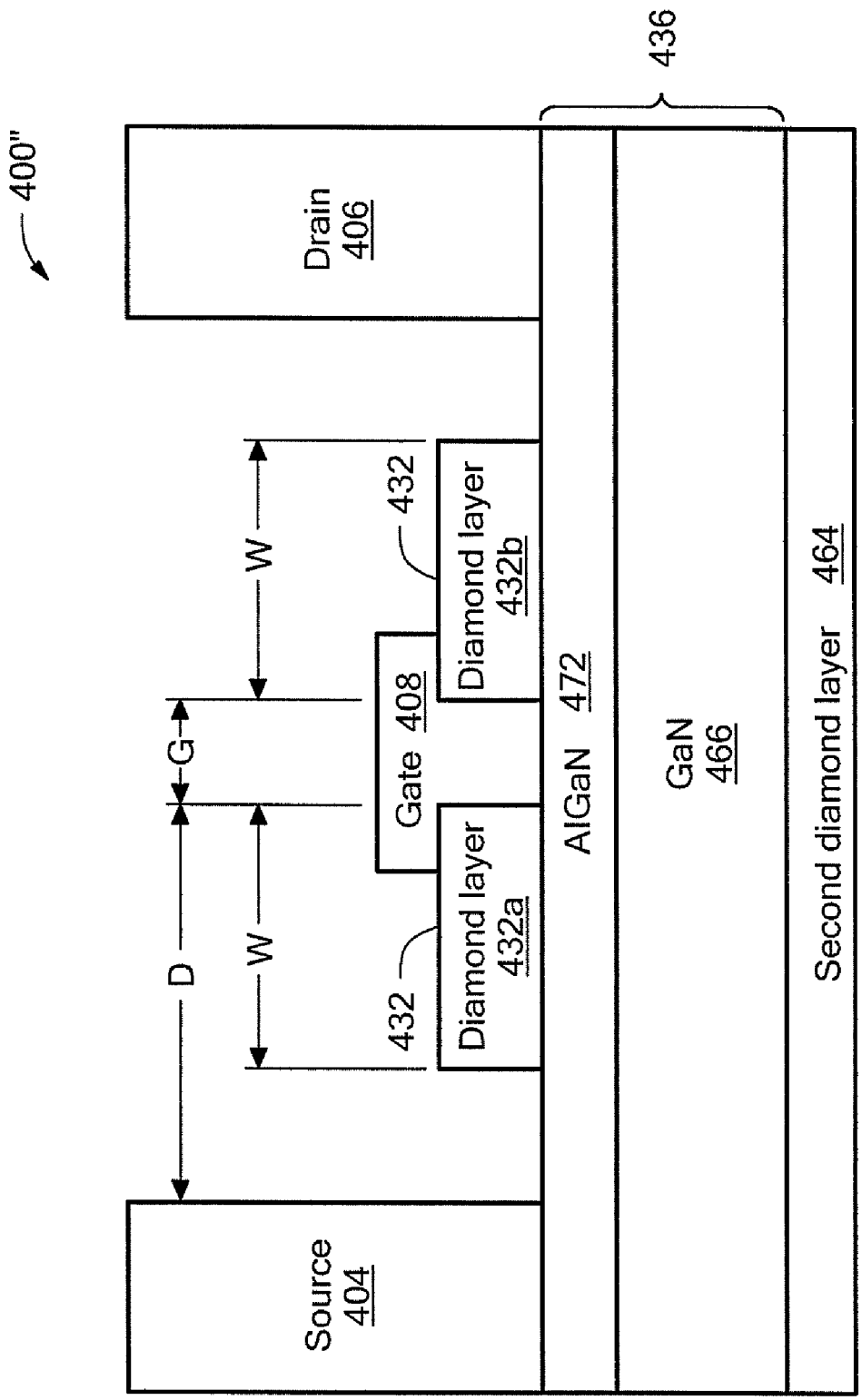
FIG. 10 is another example of the HEMT device with diamond layers.

Referring to FIG. 10, a device 400" is similar to the device 400' with the GaN-type layer 436 including an AlGaN layer 472 and a GaN layer 466. Other GaN-type materials may be added to the GaN-type layer 436 than the AlGaN 472. The GaN-type layer 436 may also be replaced with doped or undoped GaN or other GaN-type materials.

The processes to form devices 400, 400', 400" including processes to form the second diamond layer 464 are described in patent application Ser. No. 12/341,115, filed Dec. 22, 2008 and titled "FABRICATING A GALLIUM NITRIDE DEVICE WITH A DIAMOND LAYER" and patent application Ser. No. 12/341,191, filed Dec. 22, 2008 and titled "FABRICATING A GALLIUM NITRIDE LAYER WITH DIAMOND LAYERS", which are incorporated herein in their entirety and each are assigned to Raytheon Company of Waltham, Mass., the assignee of this patent application.

The devices 400, 400', 400" may include the diamond layer 432*a* extending to the source 404 and/or the diamond layer 432*b* extending to the drain 406 for surface passivation and/or heat spreading purposes.

The processes described herein are not limited to the specific embodiments described. For example, the processes are not limited to the specific processing order of the process blocks in FIGS. 1, 3, 5 and 7. Rather, any of the processing blocks of FIGS. 1, 3, 5 and 7 may be re-ordered, combined or removed, preformed in parallel or in serial, as necessary, to achieve the results set forth above. Furthermore, while photolithography is used to form the gate structures in FIGS. 1, 3, 5 and 7 one of ordinary skill in the art would recognize that photolithography may be replaced by electron beam (e-beam) lithography, for example, to etch the silicon dioxide layer to form devices with shorter gate lengths.

While the invention is shown and described in conjunction with a particular embodiment having an illustrative product having certain components in a given order, it is understood that other embodiments well within the scope of the invention are contemplated having more and fewer components, having different types of components, and being coupled in various arrangements. Such embodiments will be readily apparent to one of ordinary skill in the art. Other embodiments not specifically described herein are also within the scope of the following claims.

What is claimed is:

1. A method, comprising:
    forming a silicon dioxide layer on a surface of a first diamond layer disposed on a first surface of a gallium nitride (GaN)-type layer;
    etching the silicon dioxide layer to form a pattern;
    etching portions of the diamond exposed by the pattern; and
    disposing a second diamond layer on a second surface of the GaN-type layer opposite the first surface of the GaN-type layer.

2. The method of claim 1 wherein forming a silicon dioxide layer on a surface of a diamond layer disposed on a gallium nitride (GaN)-type layer comprises forming a silicon dioxide layer on a surface of a diamond layer disposed on an aluminum gallium nitride (AlGaN) layer disposed on a GaN layer.

3. The method of claim 1, further comprising fabricating one of a high frequency device, a high electron mobility transistor (HEMT) or a microwave device from the GaN-type layer.

4. The method of claim 1 wherein forming a silicon dioxide layer on a surface of a diamond layer disposed on a gallium nitride (GaN)-type layer comprises forming a silicon dioxide layer on a surface of a diamond layer disposed on a GaN-type layer comprising at least one of undoped GaN, doped GaN and GaN combined with another element.

5. A method, comprising:
  forming a silicon dioxide layer on a diamond layer disposed on a gallium nitride (GaN)-type layer;
  etching portions of the silicon dioxide based on a first isolation mask to expose portions of the diamond layer;
  etching the portions of the diamond layer exposed by the silicon dioxide after the first etch;
  etching portions of the silicon dioxide layer to expose a first portion and a second portion of the diamond layer;
  etching the first portion and the second portion of the diamond layer to expose a first portion and a second portion of the GaN-type layer; and
  etching portions of the GaN-type layer based on a second isolation mask.

6. The method of claim 5, further comprising:
  depositing photoresist onto the silicon dioxide layer; and
  using a photolithographic process to form a pattern with the photoresist based on the first isolation mask.

7. The method of claim 5 wherein etching the silicon dioxide layer to form a pattern comprises etching the silicon dioxide layer using an inductively coupled plasma (ICP) process.

8. The method of claim 5 wherein etching portions of the diamond layer comprises etching portions of the diamond using an inductively coupled plasma (ICP) process.

9. The method of claim 5, further comprising using a photolithographic process and a metallization process to form an ohmic contact.

10. The method of claim 5, further comprising using a photolithographic process and a metallization process to form a gate.

11. The method of claim 5, further comprising using an electron beam lithographic process and a metallization process to form a gate.

12. The method of claim 5 wherein forming a silicon dioxide layer on a surface of a diamond layer disposed on a gallium nitride layer comprises forming a silicon dioxide layer on a surface of a first diamond layer disposed on a first surface of a gallium nitride layer, and
  further comprising disposing a second diamond layer on a second surface of the GaN-type layer opposite the first surface of the GaN-type layer.

13. The method of claim 5 wherein forming a silicon dioxide layer on a surface of a diamond layer disposed on a gallium nitride (GaN)-type layer comprises forming a silicon dioxide layer on a surface of a diamond layer disposed on an aluminum gallium nitride (AlGaN) layer disposed on a GaN layer.

14. The method of claim 5, further comprising:
  using a first metallization process to form an ohmic contact on the first exposed portion of the GaN-type layer; and
  using a second metallization process to form a gate on the second exposed portion of the GaN-type layer.

15. The method of claim 5, further comprising fabricating one of a high frequency device, a high electron mobility transistor (HEMT) or a microwave device from the GaN-type layer.

16. The method of claim 5, wherein forming a silicon dioxide layer on a surface of a diamond layer disposed on a gallium nitride (GaN)-type layer comprises forming a silicon dioxide layer on a surface of a diamond layer disposed on a GaN-type layer comprising at least one of undoped GaN, doped GaN and GaN combined with another element.

17. The method of claim 7 wherein etching the silicon dioxide layer using the ICP process comprises using the ICP process using a carbon tetrafluoride and oxygen mixture.

18. The method of claim 8 wherein etching portions of the diamond layer comprises using the ICP process using an oxygen mixture.

19. The method of claim 8 wherein etching portions of the diamond layer comprises using the ICP process using an oxygen and argon mixture.

20. The method of claim 9 wherein the metallization process comprises:
  depositing a metal;
  lifting off the metal comprising removal of photoresist; and
  annealing the metal.

21. A method, comprising:
  forming a first silicon dioxide layer on a diamond layer disposed on a gallium nitride (GaN)-type layer;
  etching portions of the first silicon dioxide layer based on a first ohmic mask to expose portions of the diamond layer;
  etching the portions of the diamond layer exposed by the first silicon dioxide layer to expose a first portion of the GaN-type layer;
  forming a second silicon dioxide layer on the diamond layer and the exposed first portion of the GaN-type layer;
  etching a first portion of the second silicon dioxide layer based on a first isolation mask to expose portions of the diamond layer;
  etching the first portion of the diamond layer exposed by the second silicon dioxide;
  etching a second portion of the second silicon dioxide layer; and
  etching the second portion of the diamond layer exposed by the second silicon dioxide based to expose a second portion of the GaN-type layer.

22. The method of claim 21 wherein forming a silicon dioxide layer on a surface of a diamond layer disposed on a gallium nitride (GaN)-type layer comprises forming a silicon dioxide layer on a surface of a diamond layer disposed on an aluminum gallium nitride (AlGaN) layer disposed on a GaN layer.

23. The method of claim 21, further comprising:
  using a first metallization process to form an ohmic contact on the first portion of the GaN-type layer based on a second ohmic contact mask;
  etching portions of the GaN-type layer based on an isolation mask; and
  using a second metallization process to form a gate on the second portion of the GaN-type layer.

24. The method of claim 21, further comprising fabricating one of a high frequency device, a high electron mobility transistor (HEMT) or a microwave device from the GaN-type layer.

25. The method of claim 21, wherein forming a first silicon dioxide layer on a surface of a diamond layer disposed on a gallium nitride (GaN)-type layer comprises forming a first silicon dioxide layer on a surface of a diamond layer disposed on a GaN-type layer comprising at least one of undoped GaN, doped GaN and GaN combined with another element.

26. A method, comprising:
  forming a silicon dioxide layer on a diamond layer disposed on a gallium nitride (GaN)-type layer;
  etching portions of the silicon dioxide layer based on a multipurpose mask to expose portions of the diamond layer, the multipurpose mask being a preprocessing mask for subsequent ohmic, isolation and gate mask processing;
  etching the portions of the diamond layer exposed by the silicon dioxide to expose a first portion and a second portion of the GaN-type layer;
  using the exposed first portion of the GaN-type layer to form an ohmic contact; and
  using the exposed second portion of the GaN-type layer to form a gate.

27. The method of claim 26 wherein forming a silicon dioxide layer on a surface of a diamond layer disposed on a gallium nitride (GaN)-type layer comprises forming a silicon dioxide layer on a surface of a diamond layer disposed on an aluminum gallium nitride (AlGaN) layer disposed on a GaN layer.

28. The method of claim 26 wherein using the exposed first portion of the GaN-type layer to form an ohmic contact comprises:
  using a first metallization process to form an ohmic contact on the first exposed portion of the GaN-type layer based on an ohmic contact mask,
  wherein using the expose second portion of the GaN-type layer to form a gate comprises:
    etching portions of the GaN-type layer based on an isolation mask; and
    using a second metallization process to form a gate on the second exposed portion of the GaN-type layer.

29. The method of claim 26, further comprising fabricating one of a high frequency device, a high electron mobility transistor (HEMT) or a microwave device from the GaN-type layer.

30. The method of claim 26, wherein forming a silicon dioxide layer on a surface of a diamond layer disposed on a gallium nitride (GaN)-type layer comprises forming a silicon dioxide layer on a surface of a diamond layer disposed on a GaN-type layer comprising at least one of undoped GaN, doped GaN and GaN combined with another element.

* * * * *